(12) United States Patent
Nagaoka

(10) Patent No.: US 7,482,784 B2
(45) Date of Patent: Jan. 27, 2009

(54) DEGRADATION JUDGMENT CIRCUIT FOR SECONDARY BATTERY

(75) Inventor: Takashi Nagaoka, Ikoma (JP)

(73) Assignee: Panasonic Corporation, Osaka (JP)

( * ) Notice: Subject to any disclaimer, the term of this patent is extended or adjusted under 35 U.S.C. 154(b) by 252 days.

(21) Appl. No.: 10/890,356

(22) Filed: Jul. 12, 2004

(65) Prior Publication Data

US 2005/0017687 A1    Jan. 27, 2005

(30) Foreign Application Priority Data

Jul. 15, 2003 (JP) .............................. 2003-197162
Sep. 17, 2003 (JP) .............................. 2003-324965

(51) Int. Cl.
    *H02J 7/00* (2006.01)
(52) U.S. Cl. ..................... 320/132; 320/133; 320/134
(58) Field of Classification Search ................ 320/132, 320/21, 134, DIG. 21
    See application file for complete search history.

(56) References Cited

U.S. PATENT DOCUMENTS

| | | | | |
|---|---|---|---|---|
| 4,849,700 A * | 7/1989 | Morioka et al. | ............. | 324/427 |
| 5,608,305 A * | 3/1997 | Kokuga | ....................... | 320/133 |
| 6,469,471 B1 * | 10/2002 | Anbuky et al. | .............. | 320/118 |
| 6,910,143 B2 * | 6/2005 | Odaohhara et al. | .......... | 713/340 |
| 2001/0028238 A1 | 10/2001 | Nakamura et al. | | |
| 2004/0257043 A1 * | 12/2004 | Takaoka et al. | ............. | 320/132 |

FOREIGN PATENT DOCUMENTS

| | | |
|---|---|---|
| CN | 1320286 | 10/2001 |
| JP | 8-293329 | 11/1996 |

OTHER PUBLICATIONS

Tetsuyoshi et al., Battery Degradation Judging Device, Apr. 8, 2000, JP-2000-215923 (Machine translation).*

* cited by examiner

*Primary Examiner*—Gary L Laxton
*Assistant Examiner*—Yalkew Fantu
(74) *Attorney, Agent, or Firm*—Hamre, Schumann, Mueller & Larson, P.C.

(57) ABSTRACT

A degradation judgment circuit for a secondary battery used in a main apparatus includes a state data acquisition portion, an estimation portion, and a judgment portion. The state data acquisition portion acquires state data that shows the state of the secondary battery during a period from when the secondary battery is connected to the main apparatus to when the degradation of the secondary battery is judged. The estimation portion estimates (a) an internal resistance value at the time of judging degradation of the secondary battery or (b) a change in internal resistance value at the time of judging degradation of the secondary battery with respect to an initial internal resistance value at the time of connecting the secondary battery to the main apparatus, based on the state data. The judgment portion judges the degradation of the secondary battery based on the result of the estimation by the estimation portion.

15 Claims, 12 Drawing Sheets

__US 7,482,784 B2__

DEGRADATION JUDGMENT CIRCUIT FOR SECONDARY BATTERY

BACKGROUND OF THE INVENTION

1. Field of the Invention

The present invention relates to a degradation judgment device for a secondary battery.

2. Description of the Related Art

In recent years, a secondary battery has been available for a wide range of applications such as a backup power supply that is used, e.g., when a commercial power supply comes to a stop, a power supply for portable equipment, or a power supply for power-driven equipment.

When a secondary battery is charged/discharged repeatedly, or when a secondary battery is connected to main equipment and is charged repeatedly by the amount corresponding to self-discharge while no load is applied to the battery itself, the secondary battery is degraded and cannot perform a desired function. Then, the degraded secondary battery should be replaced with a new secondary battery.

As a technique for judging the degradation of the secondary battery, a method for judging the life of the secondary battery with a voltage during trickle charge has been proposed, e.g., by JP 8(1996)-293329 A.

However, there are some problems in this conventional configuration.

To perform the above degradation judgment, the charging current is required not only to be a constant current, but also to be maintained constant with high accuracy because this is useful in suppressing voltage fluctuations caused by a change in charging current. For example, an A-size nickel-metal hydride battery has an internal resistance (IR) of about 20 m$\Omega$. When the charging current is 1A, a current detection accuracy of several tens of mV is necessary for the degradation judgment. Accordingly, a charging circuit must be expensive.

In the conventional degradation judgment, the charging current should be a constant current. Therefore, in some cases, the degradation judgment cannot be applied to batteries other than an alkaline storage battery.

Moreover, the conventional degradation judgment circuit cannot judge degradation of a battery unless the battery is being charged.

SUMMARY OF THE INVENTION

Therefore, with the foregoing in mind, it is an object of the present invention to provide a degradation judgment circuit for a secondary battery that can be applied to any type of secondary battery and reduce the cost of designing a peripheral circuit of the battery.

A degradation judgment circuit for a secondary battery used in a main apparatus of the present invention includes a state data acquisition portion, an estimation portion, and a judgment portion. The state data acquisition portion acquires state data that shows the state of the secondary battery during a period from when the secondary battery is connected to the main apparatus to when the degradation of the secondary battery is judged. The estimation portion estimates (a) an internal resistance value at the time of judging degradation of the secondary battery or (b) a change in internal resistance value at the time of judging degradation of the secondary battery with respect to an initial internal resistance value at the time of connecting the secondary battery to the main apparatus, based on the state data. The judgment portion judges the degradation of the secondary battery based on the result of the estimation by the estimation portion.

Thus, the present invention can provide a degradation judgment circuit for a secondary battery that can be applied to any type of secondary battery, reduce the cost of designing a peripheral circuit of the battery, and judge degradation quickly.

DESCRIPTION OF THE PREFERRED EMBODIMENTS

Figure 1:
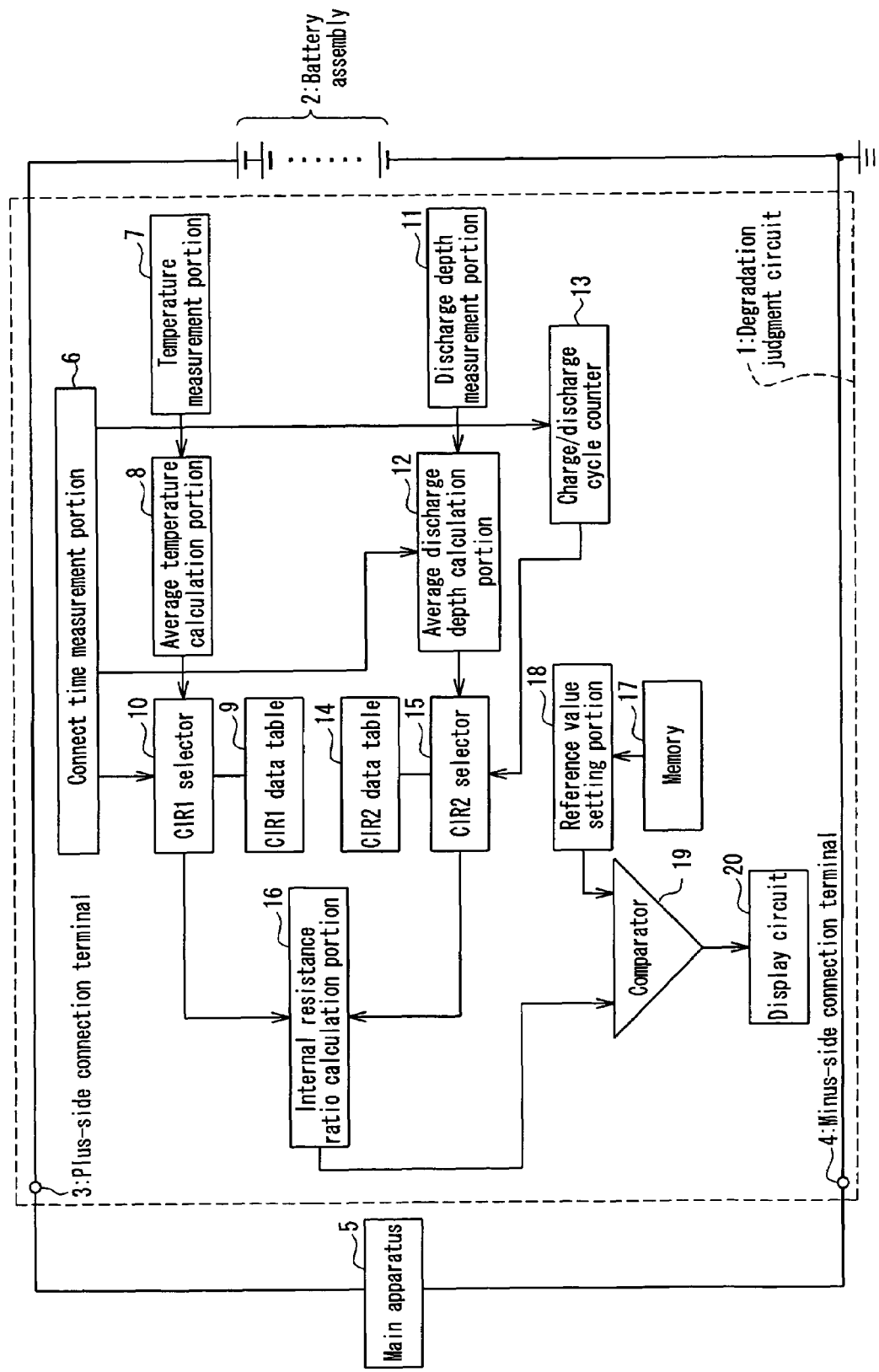
FIG. 1 is a block diagram showing the configuration of a degradation judgment circuit for a secondary battery in Embodiment 1 of the present invention.

In the degradation judgment circuit for a secondary battery of an embodiment of the present invention, the state data acquisition portion acquires state data that shows the state of the secondary battery during the period from when the secondary battery is connected to the main apparatus to when the degradation of the secondary battery is judged. Based on the state data, the estimation portion estimates (a) an internal resistance value at the time of judging degradation of the secondary battery or (b) a change in internal resistance value at the time of judging degradation of the secondary battery with respect to an initial internal resistance value at the time of connecting the secondary battery to the main apparatus. The estimation of "an internal resistance value or a change in internal resistance value" means that an internal resistance value or a change in internal resistance value at the time of judging degradation is determined by using the state data to perform extraction of experimental data or calculation with a function, rather than actually measuring the internal resistance value of the secondary battery at that time. The judgment portion judges the degradation of the secondary battery based on the internal resistance value or the change in internal resistance value estimated by the estimation portion. Therefore, the degradation of the secondary battery can be judged without actually measuring the internal resistance value at the time of judging degradation. Thus, the degradation judgment can be performed regardless of whether the secondary battery is being charged or not.

In the degradation judgment circuit for a secondary battery of an embodiment of the present invention, it is not necessary to measure an internal resistance value of the secondary battery at the time of judging degradation, and thus the charging current does not have to be a constant current. Therefore, the degradation judgment circuit of the present invention can be applied to any type of secondary battery regardless of the charging method. Moreover, there is no need to maintain the charging current constant with high accuracy, which in turn eliminates the need for an expensive charging circuit. Consequently, a peripheral circuit of the battery can be designed at low cost.

The degradation judgment circuit for a secondary battery of an embodiment of the present invention further may include a time measurement portion for measuring a connect time during which the secondary battery is connected to the main apparatus before judging degradation of the secondary battery. The state data acquisition portion may include a temperature measurement portion and an average temperature calculation portion. The temperature measurement portion measures a temperature of the secondary battery. The average temperature calculation portion calculates an average temperature during a period of time that the secondary battery is connected to the main apparatus before judging degradation of the secondary battery, based on the result of the measurement by the temperature measurement portion. The state data may include data showing the average temperature. The estimation portion may estimate (a) an internal resistance value at the time of judging degradation of the secondary battery or (b) a change in internal resistance value at the time of judging degradation of the secondary battery with respect to an initial internal resistance value at the time of connecting the secondary battery to the main apparatus, based on at least the data showing the average temperature and the connect time measured by the time measurement portion. With this configuration, the degradation judgment can be performed by estimating an internal resistance value or a change in internal resistance value using elements that are independent of any charging method, such as the connect time and the average temperature of the secondary battery.

In the degradation judgment circuit for a secondary battery of an embodiment of the present invention, the state data acquisition portion may include a charge/discharge cycle counter for counting the number of charge/discharge cycles until the degradation of the secondary battery is judged. The state data may include data showing the number of charge/discharge cycles. With this configuration, the degradation judgment can be performed by estimating an internal resistance value or a change in internal resistance value using elements that are independent of any charging method, such as the number of charge/discharge cycles.

In the degradation judgment circuit for a secondary battery of an embodiment of the present invention, the state data acquisition portion may include a discharge depth measurement portion and an average discharge depth calculation portion. The discharge depth measurement portion measures a discharge depth of the secondary battery. The average discharge depth calculation portion calculates an average discharge depth during the period from when the secondary battery is connected to the main apparatus to when the degradation of the secondary battery is judged, based on the result of the measurement by the discharge depth measurement portion. The state data may include data showing the average discharge depth. With this configuration, the degradation judgment can be performed by estimating an internal resistance value or a change in internal resistance value using elements that are independent of any charging method, such as the average discharge depth.

The degradation judgment circuit for a secondary battery of an embodiment of the present invention further may include a data table for previously storing data that shows an internal resistance value or a change in internal resistance value of the secondary battery and is based on measurement using the same type of secondary battery as the secondary battery connected to the main apparatus. The data is stored in correspondence with the state data. The estimation portion may estimate (a) an internal resistance value or (b) a change in internal resistance value of the secondary battery by referring to the data table, based on the state data acquired by the state data acquisition portion.

The use of the data table is advantageous because the degradation of the secondary battery can be judged only by referring to the data table without any manipulation of measuring an internal resistance value during operation of the secondary battery.

The degradation judgment circuit for a secondary battery of an embodiment of the present invention further may include a time measurement portion for measuring a connect time during which the secondary battery is connected to the main apparatus before judging degradation of the secondary battery. The state data acquisition portion may include a temperature measurement portion and an average temperature calculation portion. The temperature measurement portion measures a temperature of the secondary battery. The average temperature calculation portion calculates an average temperature during a period of time that the secondary battery is connected to the main apparatus before judging degradation of the secondary battery, based on the result of the measurement by the temperature measurement portion. The state data may include data showing the average temperature. The data table may include a time-temperature correspondence data table for previously storing time-temperature correspondence data that shows an internal resistance value or a change in internal resistance value of the secondary battery and is based on a test using the same type of secondary battery as the secondary battery. The time-temperature correspondence data may be based on a test that examines the relationship between the internal resistance of the same type of secondary battery, a time during which the same type of secondary battery is connected to the main apparatus, and a temperature of the same type of secondary battery during that time, and may be stored in correspondence with both data showing the time and data showing the temperature. The estimation portion may estimate (a) an internal resistance value or (b) a change in internal resistance value of the secondary battery by referring to the time-temperature correspondence data table, based on the data showing the average temperature and the data showing the connect time.

Since the estimation portion refers to the time-temperature correspondence data table based on the data showing the average temperature and the data showing the connect time, a change in the internal resistance value can be estimated using elements that are independent of any charging method, such as the connect time and the average temperature of the secondary battery.

In the degradation judgment circuit for a secondary battery of an embodiment of the present invention, the state data acquisition portion may include a charge/discharge cycle counter for counting the number of charge/discharge cycles until the degradation of the secondary battery is judged. The state data may include data showing the number of charge/discharge cycles. The data table may include a charge cycle count correspondence data table for previously storing charge cycle count correspondence data that shows an internal resistance value or a change in internal resistance value of the secondary battery and is based on a test using the same type of secondary battery as the secondary battery connected to the main apparatus. The charge cycle count correspondence data may be based on a test that examines the relationship between the internal resistance and the number of charge cycles of the same type of secondary battery, and may be stored in correspondence with data showing the number of charge cycles. The estimation portion may estimate (a) an internal resistance value or (b) a change in internal resistance value of the secondary battery by referring to the charge cycle count correspondence data table, based on the data showing the number of charge/discharge cycles.

Since the estimation portion refers to the charge cycle count correspondence data table based on the data showing the number of charge/discharge cycles, a change in internal resistance value can be estimated using elements that are independent of any charging method, such as the number of charge cycles.

In the degradation judgment circuit for a secondary battery of an embodiment of the present invention, the state data acquisition portion may include a discharge depth measurement portion and an average discharge depth calculation portion. The discharge depth measurement portion measures a discharge depth of the secondary battery. The average discharge depth calculation portion calculates an average discharge depth during the period from when the secondary battery is connected to the main apparatus to when the degradation of the secondary battery is judged, based on the result of the measurement by the discharge depth measurement portion. The state data may include data showing the average discharge depth. The charge cycle count correspondence data may be based on a test that examines the relationship between the internal resistance, the number of charge cycles, and a discharge depth of the same type of secondary battery, and may be stored in correspondence with both data showing the number of charge cycles and data showing the discharge depth. The estimation portion may estimate (a) an internal resistance value or (b) a change in internal resistance value of the secondary battery by referring to the charge cycle count correspondence data table, based on the data showing the number of charge/discharge cycles and the data showing the average discharge depth.

Since the estimation portion refers to the charge cycle count correspondence data table based on the number of charge/discharge cycles and the data showing the average discharge depth, a change in internal resistance value can be estimated using elements that are independent of any charging method, such as the number of charge cycles and the average discharge depth.

With this configuration, it is not necessary to measure the internal resistance of the battery accurately, and the degradation of the secondary battery is judged in a simple manner in which the data table is referenced based on data that can be measured in real time, such as a temperature, a discharge depth, and the number of charge/discharge cycles. Therefore, the degradation of the secondary battery can be judged quickly.

In the degradation judgment circuit for a secondary battery of an embodiment of the present invention, the judgment portion may judge the degradation of the secondary battery based on at least a value estimated by referring to the time-temperature correspondence data table and a value estimated by referring to the charge cycle count correspondence data table in the estimation portion.

Since the judgment portion judges the degradation of the secondary battery based on the values estimated by referring to the time-temperature correspondence data table and the charge cycle count correspondence data table, the degradation of the secondary battery can be judged more precisely.

The degradation judgment circuit for a secondary battery of an embodiment of the present invention further may include an out-of-temperature range time measurement portion and an out-of-temperature range defining term calculation portion. The out-of-temperature range time measurement portion measures a period of time that a temperature of the secondary battery is outside a predetermined temperature range defined as a temperature range in normal operation. The out-of-temperature range defining term calculation portion calculates an out-of-temperature range defining term based on the period of time measured by the out-of-temperature range time measurement portion and a predetermined coefficient provided in accordance with the type of the secondary battery. The judgment portion may judge the degradation of the secondary battery based on the result of the estimation by the estimation portion while taking into account the out-of-temperature range defining term. The judgment portion judges the degradation of the secondary battery in consideration of the out-of-temperature range defining term, so that the degradation judgment can reflect damage caused by the unusual temperature of the secondary battery. Thus, the degradation of the secondary battery can be judged more precisely.

The degradation judgment circuit for a secondary battery of an embodiment of the present invention further may include a deep discharge time measurement portion and a deep discharge defining term calculation portion. The deep discharge time measurement portion measures a period of time that the secondary battery is in a deep discharge state based on a voltage of the secondary battery. The deep discharge defining term calculation portion calculates a deep discharge defining term based on the period of time measured by the deep discharge time measurement portion and a predetermined coefficient provided in accordance with the type of the secondary battery. The judgment portion may judge the degradation of the secondary battery based on the result of the estimation by the estimation portion while taking into account the deep discharge defining term. The judgment portion judges the degradation of the secondary battery in consideration of the deep discharge defining term, so that the degradation judgment can reflect damage caused by the deep discharge of the secondary battery. Thus, the degradation of the secondary battery can be judged more precisely.

The degradation judgment circuit for a secondary battery of an embodiment of the present invention further may include a short-circuit time measurement portion and a short-circuit defining term calculation portion. The short-circuit time measurement portion measures a period of time that the secondary battery is in a short-circuit state based on a voltage of the secondary battery. The short-circuit defining term calculation portion calculates a short-circuit defining term based on the period of time measured by the short-circuit time measurement portion and a predetermined coefficient provided in accordance with the type of the secondary battery. The judgment portion may judge the degradation of the secondary battery based on the result of the estimation by the estimation portion while taking into account the short-circuit defining term. The judgment portion judges the degradation of the secondary battery in consideration of the short-circuit defining term, so that the degradation judgment can reflect damage caused by the external short circuit of the secondary battery. Thus, the degradation of the secondary battery can be judged more precisely.

The degradation judgment circuit for a secondary battery of an embodiment of the present invention further may include a full charge time measurement portion and a full charge defining term calculation portion. The full charge time measurement portion measures a period of time that the secondary battery is in a full charge state based on a capacity of the secondary battery. The full charge defining term calculation portion calculates a full charge defining term based on the period of time measured by the full charge time measurement portion and a predetermined coefficient provided in accordance with the type of the secondary battery. The judgment portion may judge the degradation of the secondary battery based on the result of the estimation by the estimation portion while taking into account the full charge defining term. The judgment portion judges the degradation of the secondary battery in consideration of the full charge defining term, so that the degradation judgment can reflect damage caused by the sustained full charge of the secondary battery. Thus, the degradation of the secondary battery can be judged more precisely.

A secondary battery system of an embodiment of the present invention includes the degradation judgment circuit according to an embodiment of the present invention and a secondary battery.

A method for judging degradation of a secondary battery used in a main apparatus of the present invention includes the steps of: acquiring state data that shows the state of the secondary battery during a period from when the secondary battery is connected to the main apparatus to when the degradation of the secondary battery is judged; estimating (a) an internal resistance value at the time of judging degradation of the secondary battery or (b) a change in internal resistance value at the time of judging degradation of the secondary battery with respect to an initial internal resistance value at the time of connecting the secondary battery to the main apparatus, based on the state data; and judging degradation of the secondary battery based on the result obtained by the estimating step.

Hereinafter, more specific embodiments of the present invention will be described with reference to the drawings.

Embodiment 1

The following is an explanation of a degradation judgment circuit for a secondary battery of an embodiment of the present invention. In this embodiment, a battery assembly is used as an example of the secondary battery.

FIG. 1 is a block diagram showing the configuration of a degradation judgment circuit 1 for a secondary battery in Embodiment 1 of the present invention.

The degradation judgment circuit 1 will be described in detail below.

The degradation judgment circuit 1 for a secondary battery in this embodiment is a circuit that judges degradation of a battery assembly 2. The battery assembly 2 is connected to a main apparatus 5 by a plus-side connection terminal 3 and a minus-side connection terminal 4.

A connect time measurement portion 6 measures an elapsed time (connect time) t during which the battery assembly 2 is connected to the main apparatus 5 before judging degradation of the battery assembly 2. The connect time measurement portion 6 can be formed easily, e.g., by using a timer. During a period from when the battery assembly 2 is connected to the main apparatus 5 to when the degradation of the battery assembly 2 is judged, if the battery assembly 2 is temporarily removed from the main apparatus 5 and is connected to the main apparatus 5 again, the connect time t can be obtained by subtracting the length of time the battery assembly 2 is removed from the main apparatus 5 from that period.

A temperature measurement portion 7 may be formed, e.g., by using a thermistor and measures a temperature of the battery assembly 2. Based on the temperature measured by the temperature measurement portion 7, an average temperature calculation portion 8 calculates an average temperature during a period of time that the battery assembly 2 is connected to the main apparatus 5 before judging degradation of the battery assembly 2.

The degradation judgment circuit 1 includes a CIR1 data table 9. The CIR1 data table 9 stores an internal resistance ratio (CIR1) of the battery assembly 2 beforehand. The CIR1 is the ratio of an internal resistance value at the time of judging degradation of the battery assembly 2 to an initial internal resistance value at the time of connecting the battery assembly 2 to the main apparatus 5.

Figure 2:
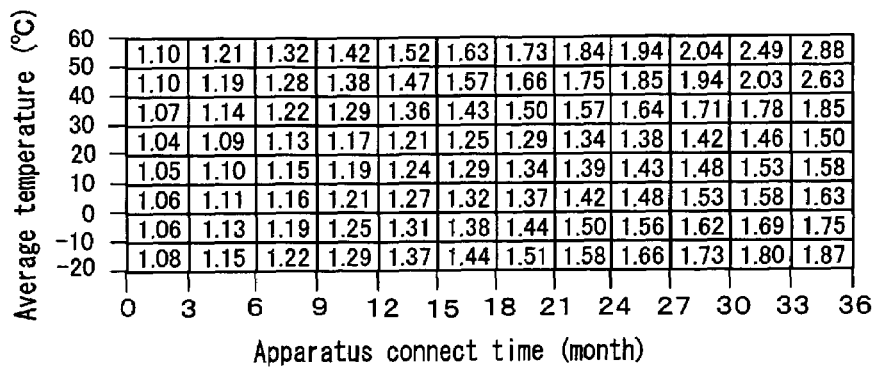
FIG. 2 shows an example of a CIR1 data table that uses an apparatus connect time and an average temperature as parameters.

FIG. 2 shows an example of the CIR1 data table 9 when an A-size nickel-metal hydride battery is used as the battery assembly 2. In the example of FIG. 2, the same type of battery assembly (a test battery) as the battery assembly 2 was connected to the main apparatus 5. Then, CIR1 of the test battery was measured every 3 months for 36 months from the time the test battery was connected to the main apparatus 5 at an average temperature between −20° C. and 60° C. in increments of 10° C. The CIR1 of the test battery thus measured is stored in the CIR1 data table 9.

Based on the time t measured by the connect time measurement portion 6 and the average temperature calculated by the average temperature calculation portion 8, a CIR1 selector 10 uniquely selects a CIR1 value from the CIR1 data table 9. For example, when t=5 and the average temperature=15° C., the CIR1 value to be selected is 1.10.

In the example of FIG. 2, the table stores data for only 36 months (3 years) of connection between the battery assembly 2 and the main apparatus 5. However, if the measured values are collected, the table can store CIR1 that corresponds to a period of more than 36 months. When the measured values are not collected, estimated values of CIR1 may be stored in the table.

By interpolating the elements (measured values) of the CIR1 data table in FIG. 2, it is possible to obtain more detailed data of the connect time during which the battery assembly 2 is connected to the main apparatus 5 and the average temperature of the battery assembly 2. The CIR1 data table 9 can be prepared beforehand in accordance with the type of the battery assembly 2.

As a specific example of this embodiment, the CIR1 is selected from the data table that stores the measured values. However, the present invention is not limited thereto. For example, the CIR1 may be determined by a function that includes as parameters at least an elapsed time t during which the battery assembly 2 is connected to the main apparatus 5 before judging degradation and the average temperature of the battery assembly 2 during the elapsed time t. In this case, the function may be obtained either theoretically or based on the measured values.

Figure 3:
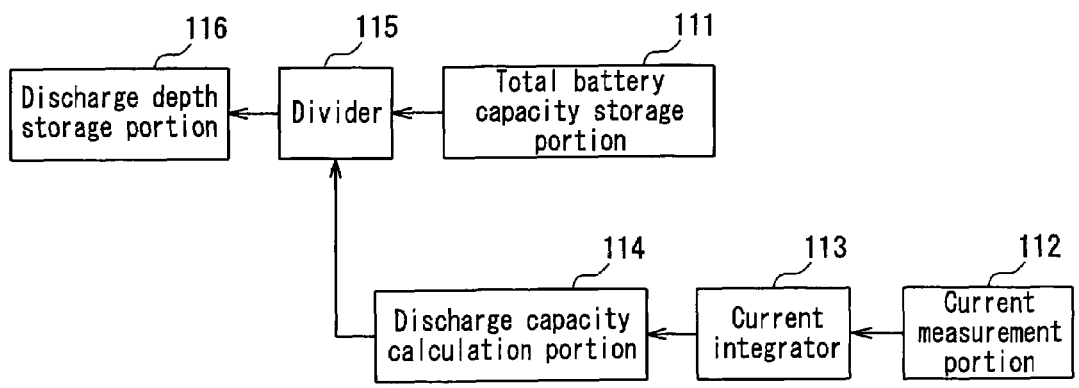
FIG. 3 is a block diagram showing the internal configuration of a discharge depth measurement portion.

The degradation judgment circuit 1 includes a discharge depth measurement portion 11 for measuring a discharge depth of the battery assembly 2. FIG. 3 is a block diagram showing an example of the internal configuration of the discharge depth measurement portion 11. A total battery capacity storage portion 111 stores the total battery capacity of the battery assembly 2. In this case, the total battery capacity is the battery capacity of a fully charged battery assembly. When the battery assembly 2 includes two or more pairs of secondary batteries, the total battery capacity of the battery assembly 2 is the sum of the capacities of each battery in the battery assembly 2. The batteries constituting the battery assembly 2 may differ from each other in capacity.

In the discharge depth measurement portion 11, a discharge current measured by a current measurement portion 112 is integrated over time by a current integrator 113. A discharge capacity calculation portion 114 calculates a discharge capacity based on the integrated value from the current integrator 113. A divider 115 calculates a discharge depth based on the discharge capacity and stores it in a discharge depth storage portion 116. The discharge depth is obtained by dividing the discharge capacity calculated in the discharge capacity calculation potion 114 by the total battery capacity stored in the total battery capacity storage portion 111.

As shown in FIG. 1, the degradation judgment circuit 1 includes an average discharge depth calculation portion 12. The average discharge depth calculation portion 12 receives the discharge depth that has been measured and stored in the discharge depth measurement portion 11, and calculates an average discharge depth during the period from when the battery assembly 2 is connected to the main apparatus 5 to when the degradation of the battery assembly 2 is judged. A charge/discharge cycle counter 13 counts the number of charge/discharge cycles during the period from when the battery assembly 2 is connected to the main apparatus 5 to when the degradation of the battery assembly 2 is judged.

The degradation judgment circuit 1 includes a CIR2 data table 14. The CIR2 data table 14 stores an internal resistance ratio (CIR2) of the battery assembly 2 beforehand. Like the CIR1, the CIR2 is the ratio of an internal resistance value at the time of judging degradation of the battery assembly 2 to an initial internal resistance value at the time of connecting the battery assembly 2 to the main apparatus 5. While the CIR1 is determined by the connect time and the average temperature during the connect time, the CIR2 is determined by the average discharge depth and the number of charge/discharge cycles. Based on the average discharge depth calculated by the average discharge depth calculation portion 12 and the number of charge/discharge cycles counted by the charge/discharge cycle counter 13, a CIR2 selector 15 uniquely selects a CIR2 value from the CIR2 data tale 14.

Figure 4:
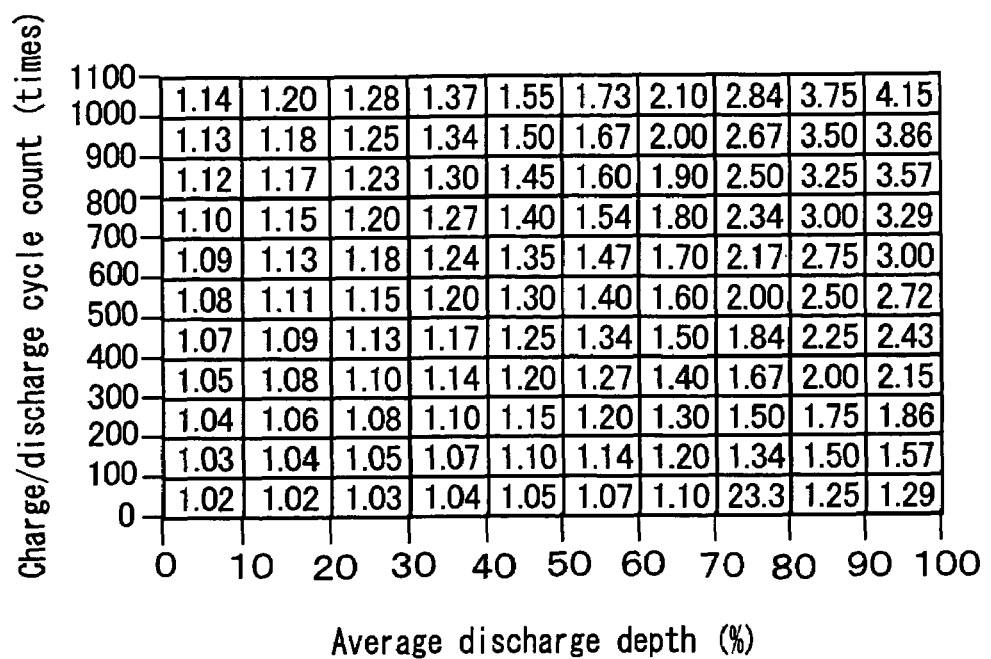
FIG. 4 shows an example of a CIR2 data table that uses an average discharge depth and a charge/discharge cycle count as parameters.

FIG. 4 shows an example of the CIR2 data table 14 when an A-size nickel-metal hydride battery is used as the battery assembly 2. In the example of FIG. 4, CIR2 was measured at every 10% from 0 to 100% of the average discharge depth for a charge/discharge cycle count between 0 to 1100 times in increments of 100 times. The CIR2 thus measured is stored in the CIR2 data table 14.

The CIR2 that corresponds to a charge/discharge cycle of more than 1100 times may be obtained by measurement or estimation and stored in the CIR2 data table 14. By interpolating the elements (measured values) of the CIR2 data table, it is possible to obtain more detailed data of the average discharge depth and the number of charge/discharge cycles. The CIR2 data table 14 also can be prepared beforehand in accordance with the type of the battery assembly 2.

As a specific example of this embodiment, the CIR2 is selected from the data table that stores the measured values. However, the present invention is not limited thereto. For example, the CIR2 may be determined by a function that includes as parameters the average discharge depth and the number of charge/discharge cycles. In this case, the function may be obtained either theoretically or based on the measured values.

An internal resistance ratio calculation portion 16 calculates an internal resistance ratio based on at least the CIR1 selected by the CIR1 selector 10 and the CIR2 selected by the CIR2 selector 15. For example, the internal resistance ratio can be a value (CIR1×CIR2) obtained by multiplying the CIR1 by the CIR2.

A memory 17 stores a reference value beforehand. The reference value is used for judging battery degradation from the internal resistance ratio. This reference value also can be determined by previous measurement using the same type of battery as the battery assembly 2. For an A-size nickel-metal hydride battery, e.g., the memory 17 preferably stores a reference value of 2.5 to 3.0. The reference value stored in the memory 17 is set in a reference value setting portion 18. A comparator 19 compares the reference value set by the reference value setting portion 18 with the internal resistance ratio (CIR1×CIR2) calculated by the internal resistance ratio calculation portion 16. When the internal resistance ratio is equal to or larger than the reference value, the comparator 19 judges that the battery assembly 2 is degraded. Subsequently, a message or the like that indicates the degradation of the battery assembly 2 is output to a display circuit 20.

As described above, the degradation judgment circuit 1 for a secondary battery of this embodiment includes a state data acquisition portion (the temperature measurement portion 7, average temperature calculation portion 8, discharge depth measurement portion 11, average discharge depth calculation portion 12, and charge/discharge cycle counter 13). The state data acquisition portion acquires state data (an average temperature, average discharge depth, and the number of charge/discharge cycles) that shows the state of the battery assembly 2 during the period from when the battery assembly 2 is connected to the main apparatus 5 to when the degradation of the battery assembly 2 is judged. An internal resistance estimation portion (the CIR1 selector 10, CIR2 selector 15, and internal resistance ratio calculation portion 16) estimates a change in internal resistance value with time from the data table based on the state data. Therefore, it is not necessary to measure an internal resistance value of the battery assembly 2 at the time of judging degradation. Thus, the degradation of the battery assembly 2 can be judged even if the battery assembly 2 is not being charged, so that a quick judgment can be performed with a simple peripheral circuit regardless of the type of secondary battery.

This embodiment is simply for the purpose of presenting a specific example, and the present invention is not limited thereto. The present invention also includes the following modified examples in its technical scope. The following modified examples can be applied to the other embodiments as described later.

In this embodiment, e.g., the degradation of the battery assembly 2 is judged by comparing the product of CIR1 and CIR2 with the reference value. However, the degradation of the battery assembly 2 may be judged based on either of the CIR1 and CIR2. For example, when only the CIR1 is used, the discharge depth measurement portion 11, the average discharge depth calculation portion 12, and the CIR2 selector 15 are not necessary, so that the configuration of the degradation judgment circuit can be made even simpler.

In this embodiment, the ratio (CIR1, CIR2) of an internal resistance value at the time of judging degradation of the battery assembly 2 to an initial internal resistance value at the time of connecting the battery assembly 2 to the main apparatus 5 is used as data that shows a change in internal resistance value from the time when the battery assembly 2 is connected to the main apparatus 5. However, the data showing a change in internal resistance value is not limited thereto. For example, data obtained by any calculation may be used as long as it is possible to understand how the internal resistance value is changed by using an initial resistance value at the time of connecting the battery assembly 2 to the main apparatus 5 as the reference.

Embodiment 2

The following is an explanation of Embodiment 2 of the present invention. In this embodiment, a battery assembly is used as an example of a secondary battery.

Figure 5:
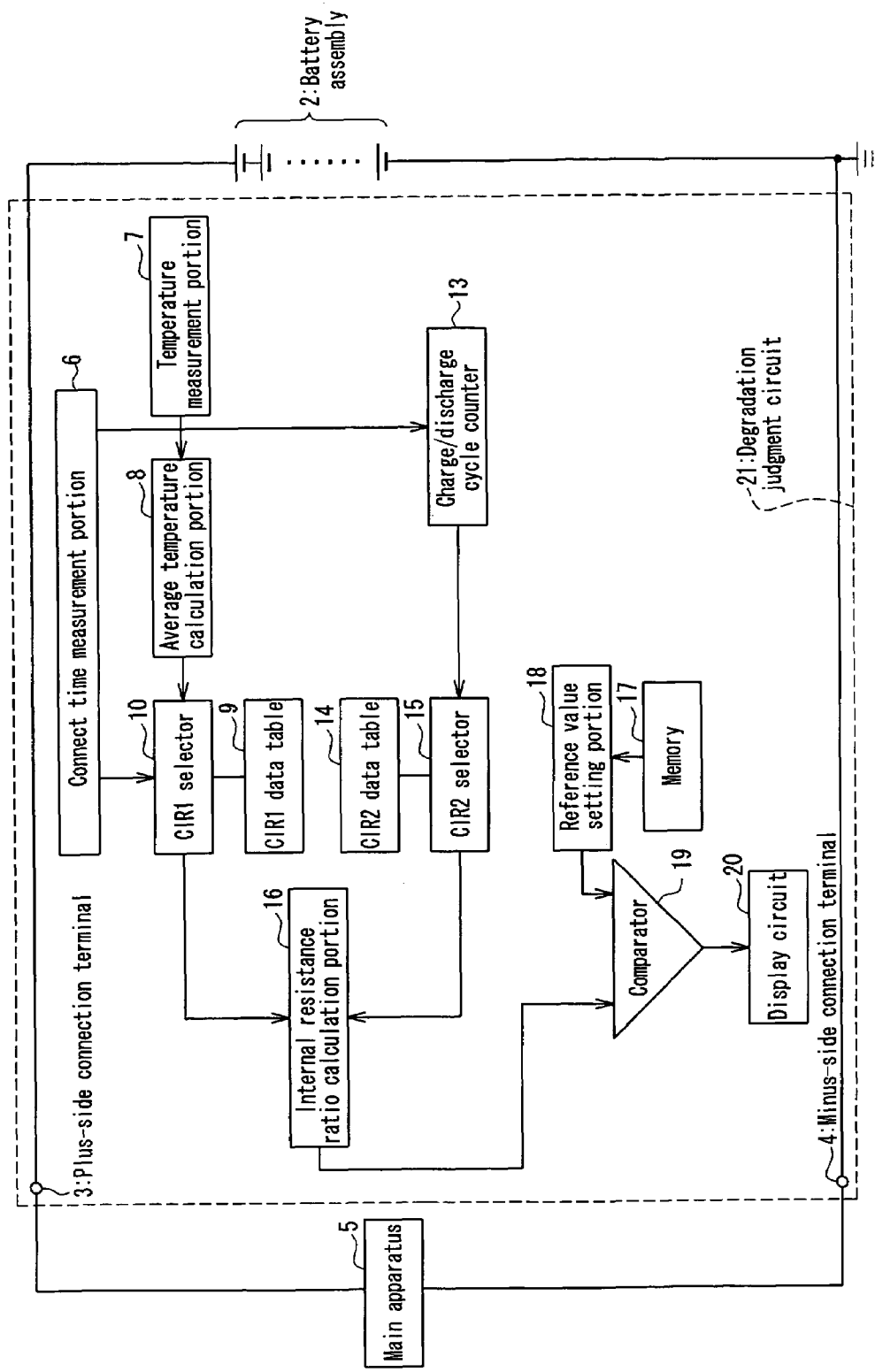
FIG. 5 is a block diagram showing the configuration of a degradation judgment circuit for a secondary battery in Embodiment 2 of the present invention.

FIG. 5 is a block diagram showing the configuration of a degradation judgment circuit 21 for a secondary battery in this embodiment. The elements common to the degradation judgment circuit 1 in Embodiment 1 are denoted by the same reference numerals, and the detailed description will not be repeated.

Embodiment 2 of the present invention is an example of the degradation judgment circuit for a secondary battery having a constant discharge depth. The secondary battery having a constant discharge depth may be used, e.g., as a backup power supply when a commercial power supply fails. When a power failure occurs during the operation of a computer, the secondary battery can serve as a backup power supply in a shutdown process for the computer. In many cases, the discharge depth of the secondary battery used in the shutdown process is constant.

In performing degradation judgment with the degradation judgment circuit 21, the average temperature calculation portion 8 calculates an average temperature of the battery assembly 2 during the connect time based on the results of the measurement by the connect time measurement portion 6 and the temperature measurement portion 7. The charge/discharge cycle counter 13 counts the number of charge/discharge cycles of the battery assembly 2 during the connect time. In this embodiment, the battery assembly 2 has a constant discharge depth. Therefore, unlike Embodiment 1, it is necessary neither to measure a discharge depth nor to calculate an average discharge depth during the connect time. Thus, the discharge depth measurement portion 11 and the average discharge depth calculation portion 12 as shown in FIG. 1 of Embodiment 1 are not required.

The CIR1 data table 9 may be the same as that in Embodiment 1 (see FIG. 2). The CIR2 data table 14 also may be the same as that in Embodiment 1 (see FIG. 4). The CIR2 selector 15 of this embodiment selects CIR2 from the CIR2 data table 14 by using the discharge depth (constant) of the battery assembly 2 and the number of charge/discharge cycles at the time of judging degradation of the battery assembly 2, instead of the average discharge depth in Embodiment 1.

Based on the CIR2 thus selected and the CIR1 selected by the CIR1 selector 10 with reference to the CIR1 data table 9, degradation of the battery assembly 2 is judged in the same manner as Embodiment 1, and then the result is output to the display circuit 20.

Embodiment 3

The following is an explanation of Embodiment 3 of the present invention. In this embodiment, a battery assembly is used as an example of a secondary battery.

Figure 6:
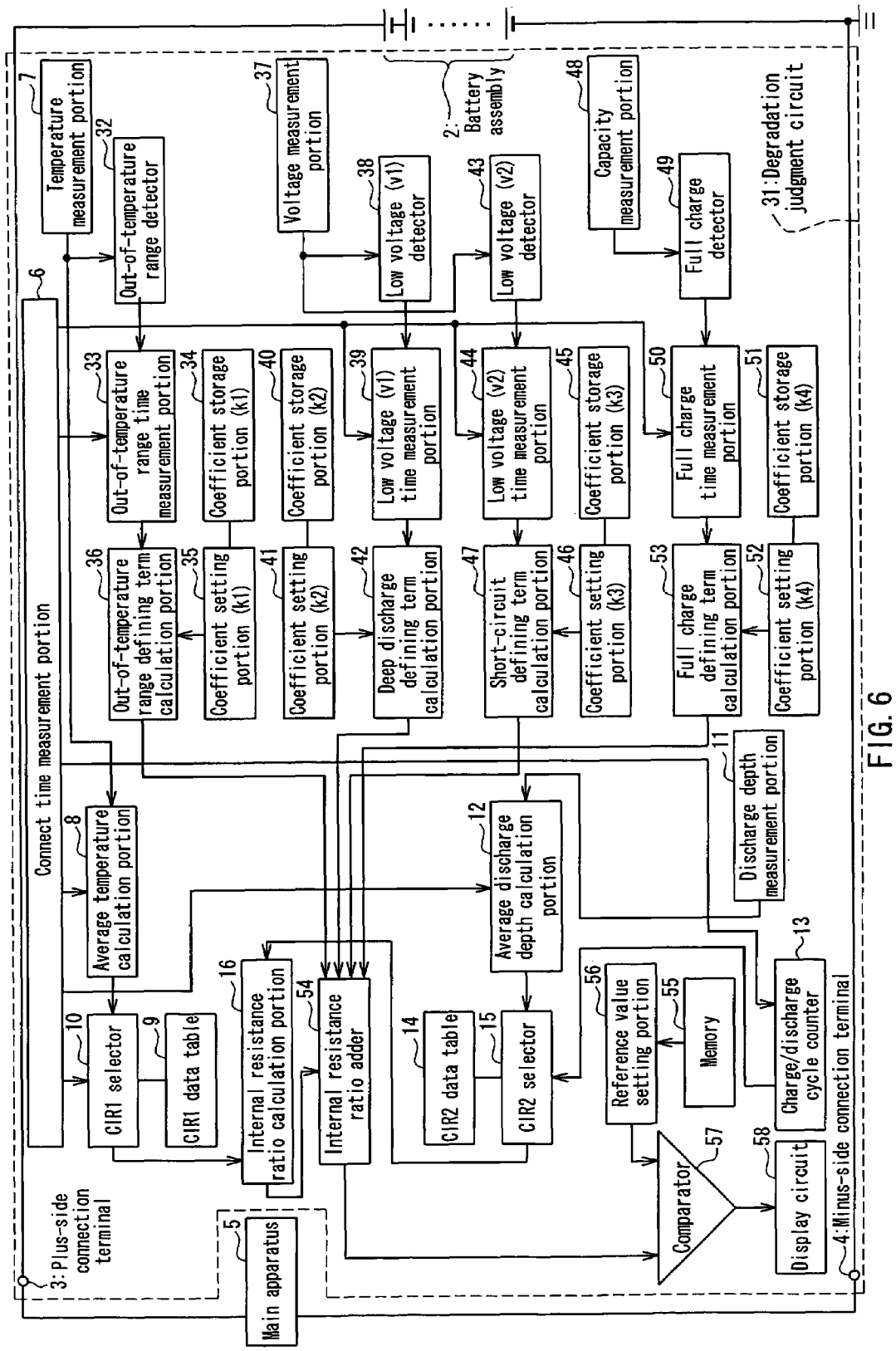
FIG. 6 is a block diagram showing the configuration of a degradation judgment circuit for a secondary battery in Embodiment 3 of the present invention.

FIG. 6 is a block diagram showing the configuration of a degradation judgment circuit 31 for a secondary battery in this embodiment. The elements common to the degradation judgment circuit 1 in Embodiment 1 as shown in FIG. 1 are denoted by the same reference numerals, and the detailed description will not be repeated.

The degradation judgment circuit 31 for a secondary battery in this embodiment is a circuit that judges degradation of a battery assembly 2. As shown in FIG. 6, the battery assembly 2 is connected to the main apparatus 5 by the plus-side connection terminal 3 and the minus-side connection terminal 4.

The degradation judgment circuit 31 includes an out-of-temperature range time measurement portion 33 for measuring a period of time that the temperature of the battery assembly 2 that has been measured by the temperature measurement portion 7 is outside a temperature range in the normal operation of the battery assembly 2. The temperature range in the normal operation may be, e.g., $-20°$ C. to $60°$ C. In this case, the out-of-temperature range time measurement portion 33 measures a time (t1) during which the temperature of the battery assembly 2 is unusual, such as higher than $60°$ C. or lower than $-20°$ C. An out-of-temperature range defining term calculation portion 36 multiplies the time (t1) by a coefficient k1. The product (t1×k1) is identified as an out-of-temperature range defining term. The coefficient k1 is stored in a coefficient storage portion 34 beforehand. The coefficient storage portion 34 may be formed, e.g., by using a memory. The coefficient k1 is sent to the out-of-temperature range defining term calculation portion 36 by a coefficient setting portion 35.

A voltage measurement portion 37 measures a voltage of the battery assembly 2. Based on the measurement by the voltage measurement portion 37, a low voltage (v1) detector 38 detects whether the voltage of the battery assembly 2 is lower than a predetermined voltage (V1). In this case, the predetermined voltage (V1) is a boundary value used for determining whether the battery assembly 2 is in the deep discharge state. That is, the battery assembly 2 having a voltage of not more than V1 is in the deep discharge state. For example, when the battery assembly 2 is a nickel-metal hydride battery, the V1 value may be, e.g., 0.7 V/cell.

A low voltage (v1) time measurement portion 39 measures a time (t2) during which the voltage of the battery assembly 2 is lower than V1. A deep discharge defining term calculation portion 42 multiplies the time (t2) by a coefficient k2. The product (k2×t2) is identified as a deep discharge defining term. The coefficient k2 is stored in a coefficient storage portion 40 beforehand. The coefficient storage portion 40 may be formed, e.g., by using a memory. The coefficient k2 is sent to the deep discharge defining term calculation portion 42 by a coefficient setting portion 41.

The voltage data of the battery assembly 2 measured by the voltage measurement portion 37 also is sent to a low voltage (v2) detector 43. Based on the measurement by the voltage measurement portion 37, the low voltage (v2) detector 43 detects whether the voltage of the battery assembly 2 is lower than a predetermined voltage (V2). In this case, the predetermined voltage (V2) is a boundary value used for determining whether the battery assembly 2 is short-circuited. The V2 value may be set in accordance with the type of the battery assembly 2. For example, when the battery assembly 2 is a nickel-metal hydride battery, the V2 value may be, e.g., 0.1 V/cell.

A low voltage (v2) time measurement portion 44 measures a time (t3) during which the voltage of the battery assembly 2 is lower than V2. A short-circuit defining term calculation portion 47 multiplies the time (t3) by a coefficient k3. The product (k3×t3) is identified as a short-circuit defining term. The coefficient k3 is stored in a coefficient storage portion 45 beforehand. The coefficient storage portion 45 may be formed, e.g., by using a memory. The coefficient k3 is sent to the short-circuit defining term calculation portion 47 by a coefficient setting portion 46.

A capacity measurement portion 48 measures a residual capacity of the battery assembly 2. Based on the measurement by the capacity measurement portion 48, a full charge detector 49 detects whether the battery assembly 2 is in the full charge state. In this case, the full charge state may be defined as a state in which the residual capacity is 100% or as a state in which the residual capacity is not less than a predetermined value (e.g., 95%). Based on the detection by the full charge detector 49, a full charge time measurement portion 50 measures a time (t4) during which the battery assembly 2 is in the full charge state. A full charge defining term calculation portion 53 multiplies the time (t4) by a coefficient k4. The product (k4×t4) is identified as a full charge defining term. The coefficient k4 is stored in a coefficient storage portion 51 beforehand. The coefficient storage portion 51 may be formed, e.g., by using a memory. The coefficient k4 is sent to the full charge defining term calculation portion 53 by a coefficient setting portion 52.

An internal resistance ratio adder 54 adds CIR1×CIR2 calculated by the internal resistance ratio calculation portion 16, the out-of-temperature range defining term (k1×t1) calculated by the out-of-temperature range defining term calculation portion 36, the deep discharge defining term (k2×t2) calculated by the deep discharge defining term calculation portion 42, the short-circuit defining term (k3×t3) calculated by the short-circuit defining term calculation portion 47, and the full charge defining term (k4×t4) calculated by the full charge defining term calculation portion 53.

A memory 55 stores a reference value beforehand. The reference value is used for judging battery degradation and can be determined by previous measurement using the same type of battery as the battery assembly 2. For an A-size nickel-metal hydride battery, e.g., the memory 55 preferably stores a reference value of 2.5 to 3.0. The reference value stored in the memory 55 is set in a reference value setting portion 56. A comparator 57 compares the sum (CIR1×CIR2+k1×t1+k2×t2+k3×t3 +k4×t4) calculated by the internal resistance ratio adder 54 with the reference value set by the reference value setting portion 56. When the sum is equal to or larger than the reference value, the comparator 57 judges that the battery assembly 2 is degraded. Subsequently, a message or the like that indicates the degradation of the battery assembly 2 is output to a display circuit 58.

The coefficients k1 to k4 may be selected in accordance with the type of the battery assembly 2. For example, in the case of a nickel-metal hydride battery, the coefficients preferably satisfy k4=0, k1>0, k2>0, and k3>0. In the case of a lithium ion battery, the coefficients preferably satisfy k1=0, k2>0, k3>0, and k4>0.

In this embodiment, all of the defining terms, i.e., the out-of-temperature range defining term (k1×t1), the deep discharge defining term (k2×t2), the short-circuit defining term (k3×t3), and the full charge defining term (k4×t4) are determined and incorporated into the degradation judgment. However, one or more than one defining term of any of these defining terms may be used for the degradation judgment as needed.

Embodiment 4

Figure 7:
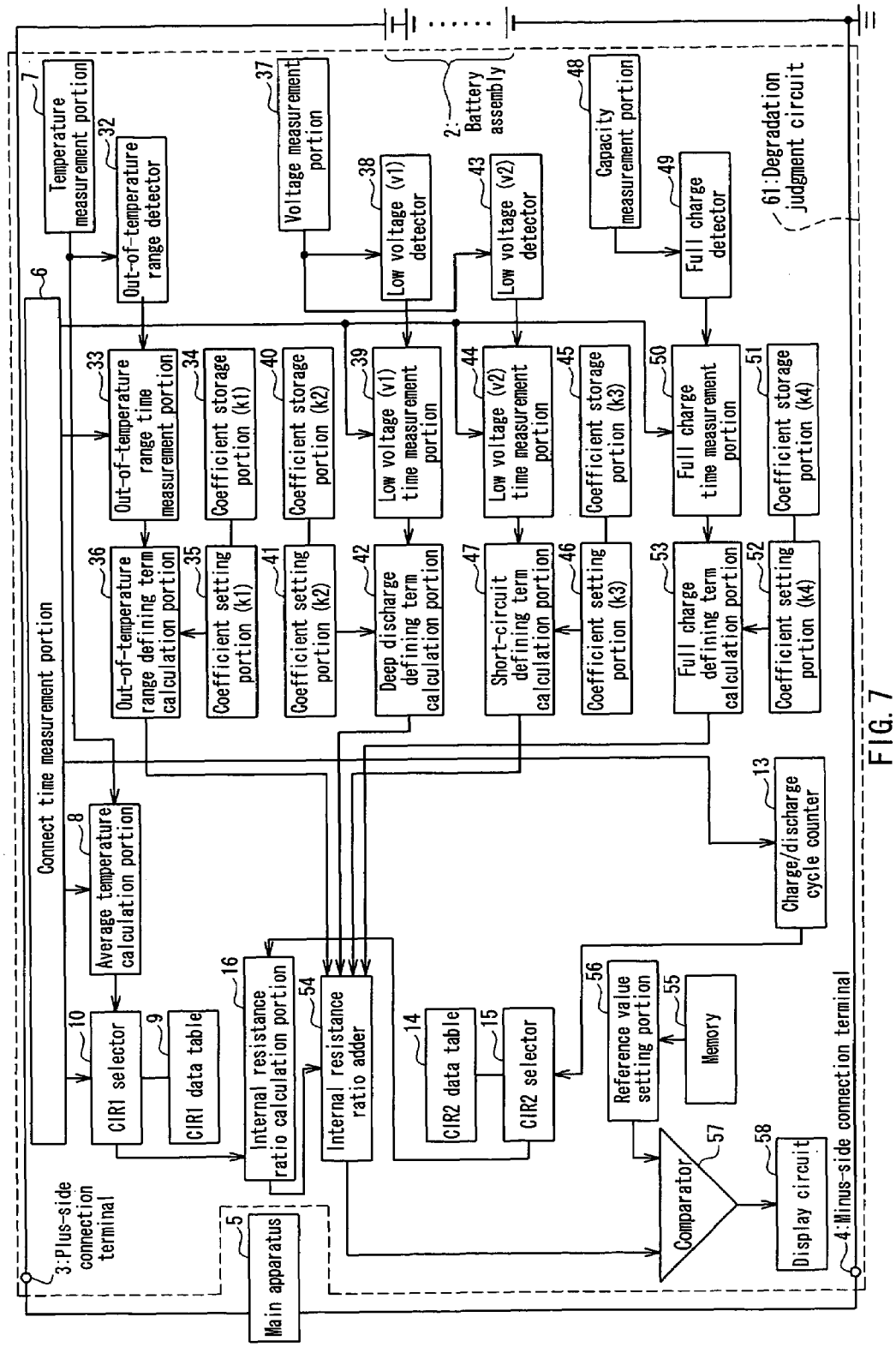
FIG. 7 is a block diagram showing the configuration of a degradation judgment circuit for a secondary battery in Embodiment 4 of the present invention.

FIG. 7 is a block diagram showing the configuration of a degradation judgment circuit for a secondary battery in Embodiment 4 of the present invention.

The following is an explanation of a degradation judgment circuit 61 in FIG. 7. The elements common to the degradation judgment circuit 31 in Embodiment 3 as shown in FIG. 6 are denoted by the same reference numerals, and the detailed description will not be repeated.

The degradation judgment circuit 61 is an example of the degradation judgment circuit for a secondary battery having a constant discharge depth. The secondary battery having a constant discharge depth may be used, e.g., as a backup power supply when a commercial power supply fails. When a power failure occurs during the operation of a computer, the secondary battery can serve as a backup power supply in a shutdown process for the computer. In many cases, the discharge depth of the secondary battery used in the shutdown process is constant.

In performing degradation judgment with the degradation judgment circuit 61, the average temperature calculation portion 8 calculates an average temperature of the battery assembly 2 during the connect time based on the results of the measurement by the connect time measurement portion 6 and the temperature measurement portion 7. The charge/discharge cycle counter 13 counts the number of charge/discharge cycles of the battery assembly 2 during the connect time. In this embodiment, the battery assembly 2 has a constant discharge depth. Therefore, unlike Embodiment 3, it is necessary neither to measure a discharge depth nor to calculate an average discharge depth during the connect time. Thus, the discharge depth measurement portion 11 and the average discharge depth calculation portion 12 as shown in FIG. 6 of Embodiment 3 are not required.

The CIR1 data table 9 may be the same as that in Embodiment 1 (see FIG. 2). The CIR2 data table 14 also may be the same as that in Embodiment 1 (see FIG. 4). The CIR2 selector 15 of this embodiment selects CIR2 from the CIR2 data table 14 by using the discharge depth (constant) of the battery assembly 2 and the number of charge/discharge cycles at the time of judging degradation of the battery assembly 2, instead of the average discharge depth in Embodiment 1.

The internal resistance ratio calculation portion 16 calculates an internal resistance ratio (CIR1×CIR2) based on the CIR1 and CIR2. As described in Embodiment 3, the out-of-temperature range defining term calculation portion 36, the deep discharge defining term calculation portion 42, the short-circuit defining term calculation portion 47, and the full charge defining term calculation portion 53 calculate an out-of-temperature range defining term (k1×t1), a deep discharge defining term (k2×t2), a short-circuit defining term (k3×t3), and a full charge defining term (k4×t4), respectively. Moreover, the internal resistance ratio adder 54 determines the sum (CIR1×CIR2+k1×t1+k2×t2+k3×t3+k4×t4) of the internal resistance ratio, the out-of-temperature range defining term, the deep discharge defining term, the short-circuit defining term, and the full charge defining term. The comparator 57 compares the reference value with the sum and judges degradation of the battery assembly 2 in the same manner as Embodiment 3, and then the result is output to the display circuit 58.

In this embodiment, all of the defining terms, i.e., the out-of-temperature range defining term (k1×t1), the deep discharge defining term (k2×t2), the short-circuit defining term (k3×t3), and the full charge defining term (k4×t4) are determined and incorporated into the degradation judgment. However, one to three defining terms of any of these defining terms may be used for the degradation judgment as needed.

Embodiment 5

Figure 8:
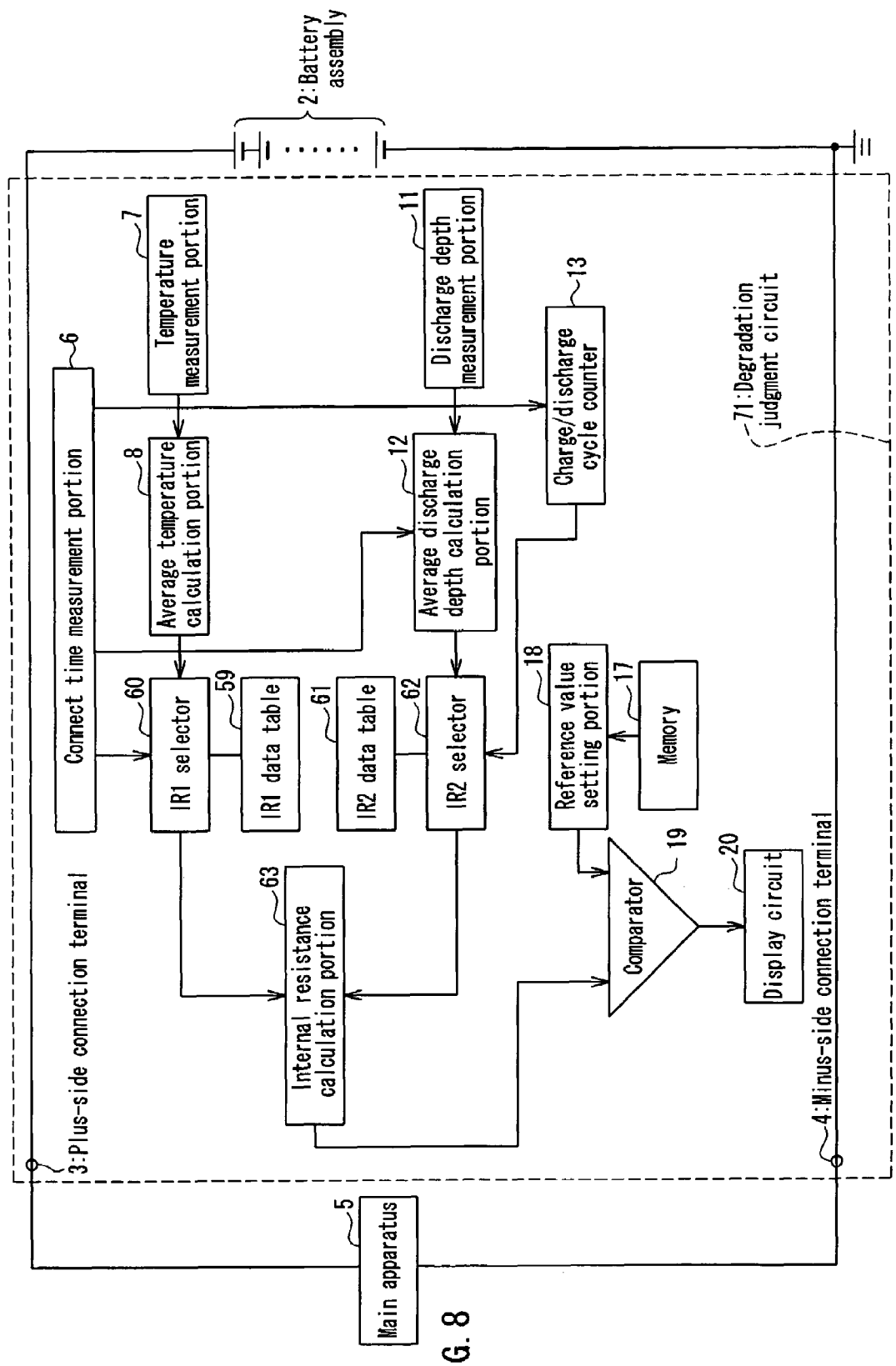
FIG. 8 is a block diagram showing the configuration of a degradation judgment circuit for a secondary battery in Embodiment 5 of the present invention.

FIG. 8 is a block diagram showing the configuration of a degradation judgment circuit for a secondary battery in Embodiment 5 of the present invention.

The following is an explanation of a degradation judgment circuit 71 in FIG. 8. The elements common to the degradation judgment circuit 1 in Embodiment 1 as shown in FIG. 1 are denoted by the same reference numerals, and the detailed description will not be repeated.

The degradation judgment circuit 71 of Embodiment 5 differs from the degradation judgment circuit 1 of Embodiment 1 in the following point. The degradation judgment circuit 1 judges degradation of the battery assembly 2 by comparing the product of CIR1 and CIR2 with the reference value, while the degradation judgment circuit 71 judges degradation of the battery assembly 2 by comparing the sum of a first internal resistance value (IR1) and a second internal resistance value (IR2) with the reference value. In this case, the IR1 and IR2 are internal resistance values at the time of judging degradation.

Moreover, the degradation judgment circuit 71 (FIG. 8) differs from the degradation judgment circuit 1 (FIG. 1) in that it includes an IR1 data table 59, an IR1 selector 60, an IR2 data table 61, an IR2 selector 62, and an internal resistance calculation portion 63.

Figure 9:
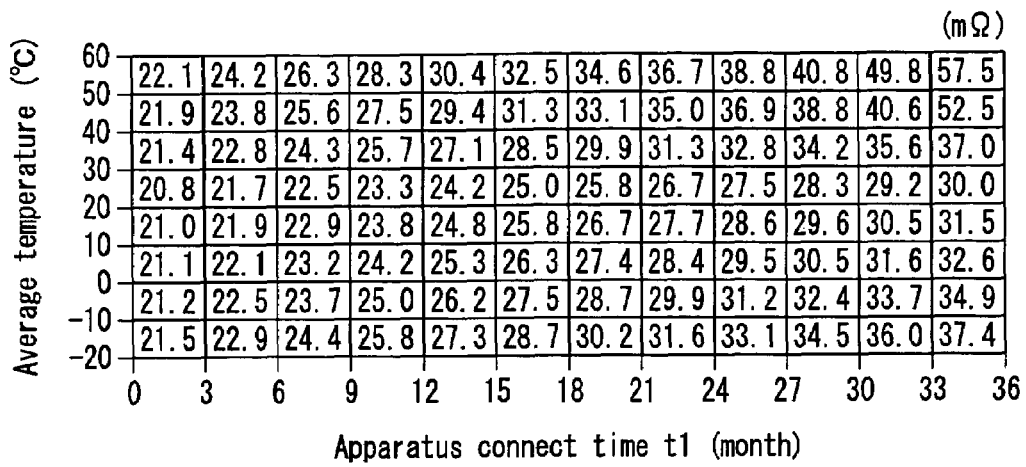
FIG. 9 shows an example of an IR1 data table that uses an apparatus connect time and an average temperature as parameters.

FIG. 9 shows an example of the IR1 data table 59 when an A-size nickel-metal hydride battery is used as the battery assembly 2. In the example of FIG. 9, the same type of battery assembly (a test battery) as the battery assembly 2 was connected to the main apparatus 5. Then, IR1 of the test battery was measured every 3 months for 36 months from the time the test battery was connected to the main apparatus 5 at an average temperature between −20° C. and 60° C. in increments of 10° C. The IR1 of the test battery thus measured is stored in the IR1 data table 59.

Based on the time t measured by the connect time measurement portion 6 and the average temperature calculated by the average temperature calculation portion 8, the IR1 selector 60 uniquely selects an IR1 value from the IR1 data table 59. For example, when t=5 (months) and the average temperature=15° C., the IR1 value to be selected is 21.9 (mΩ).

In the example of FIG. 9, the table stores data for only 36 months (3 years) of connection between the battery assembly 2 and the main apparatus 5. However, if the measured values are collected, the table can store IR1 that corresponds to a period of more than 36 months. When the measured values are not collected, estimated values of IR1 may be stored in the table.

By interpolating the elements (measured values) of the IR1 data table in FIG. 9, it is possible to obtain more detailed data of the connect time during which the battery assembly 2 is connected to the main apparatus 5 and the average temperature of the battery assembly 2. The IR1 data table 59 can be prepared beforehand in accordance with the type of the battery assembly 2.

As a specific example of this embodiment, the IR1 is selected from the data table that stores the measured values. However, the present invention is not limited thereto. For example, the IR1 may be determined by a function that includes as parameters at least an elapsed time t during which the battery assembly 2 is connected to the main apparatus 5 before judging degradation and the average temperature of the battery assembly 2 during the elapsed time t.

Like the IR1, the IR2 is an internal resistance value at the time of judging degradation. While the IR1 is determined by the connect time and the average temperature during the connect time, the IR2 is determined by the average discharge depth and the number of charge/discharge cycles.

Figure 10:
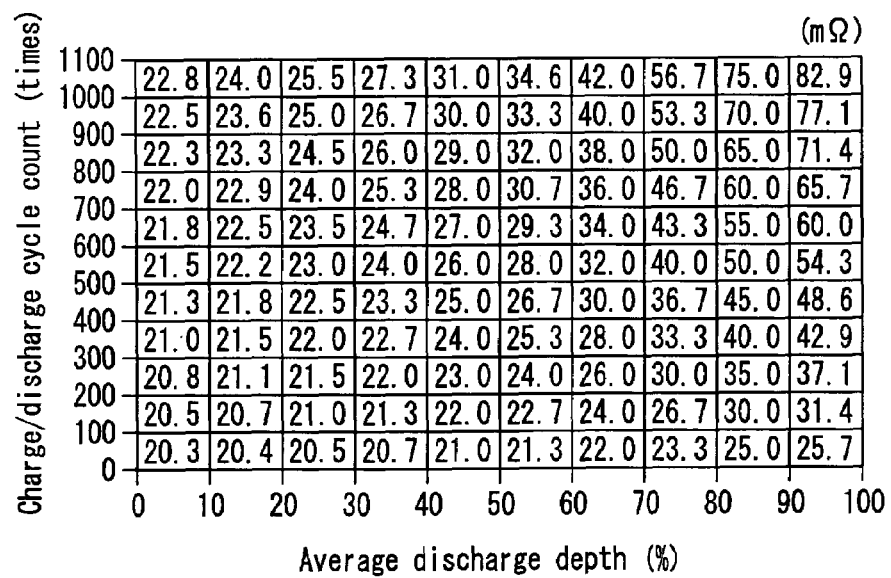
FIG. 10 shows an example of an IR2 data table that uses an average discharge depth and a charge/discharge cycle count as parameters.

FIG. 10 shows an example of the IR2 data table 61 when an A-size nickel-metal hydride battery is used as the battery assembly 2. In the example of FIG. 10, IR2 was measured at every 10% from 0 to 100% of the average discharge depth for a charge/discharge cycle count between 0 to 1100 times in increments of 100 times. The IR2 thus measured is stored in the IR2 data table 61.

Based on the average discharge depth calculated by the average discharge depth calculation portion 12 and the number of charge/discharge cycles counted by the charge/discharge cycle counter 13, the IR2 selector 62 uniquely selects an IR2 value from the IR2 data table 61. For example, when the average discharge depth is 15% and the number of charge/discharge cycles is 718 times, the IR2 value to be selected is 22.9 mΩ.

The IR2 that corresponds to a charge/discharge cycle of more than 1100 times may be obtained by measurement or estimation and stored in the IR2 data table 61. By interpolating the elements (measured values) of the IR2 data table, it is possible to obtain more detailed data of the average discharge depth and the number of charge/discharge cycles. The IR2 data table 61 also can be prepared beforehand in accordance with the type of the battery assembly 2.

As a specific example of this embodiment, the IR2 is selected from the data table that stores the measured values. However, the present invention is not limited thereto. For example, the IR2 may be determined by a function that includes as parameters the average discharge depth and the number of charge/discharge cycles. In this case, the function may be obtained either theoretically or based on the measured values.

The internal resistance calculation portion 63 calculates an internal resistance value based on at least the IR1 selected by the IR1 selector 60 and the IR2 selected by the IR2 selector 62. For example, the internal resistance value can be a value (IR1+IR2) obtained by adding the IR1 and IR2.

The memory 17 stores a reference value beforehand. The reference value is used for judging battery degradation from the internal resistance value. This reference value also can be determined by previous measurement using the same type of battery as the battery assembly 2. For an A-size nickel-metal hydride battery, e.g., the memory 17 preferably stores a reference value of 50 to 60 mΩ. The reference value stored in the memory 17 is set in the reference value setting portion 18. The comparator 19 compares the reference value set by the reference value setting portion 18 with the internal resistance value (IR1+IR2) calculated by the internal resistance calculation portion 63. When the internal resistance value is equal to or larger than the reference value, the comparator 19 judges that the battery assembly 2 is degraded. Subsequently, a message or the like that indicates the degradation of the battery assembly 2 is output to the display circuit 20.

In this embodiment, all or part of the defining terms, i.e., the out-of-temperature range defining term (k1×t1), the deep discharge defining term (k2×t2), the short-circuit defining term (k3×t3), and the full charge defining term (k4×t4) can be determined and incorporated into the degradation judgment, as described in Embodiment 3.

Embodiment 6

Figure 11:
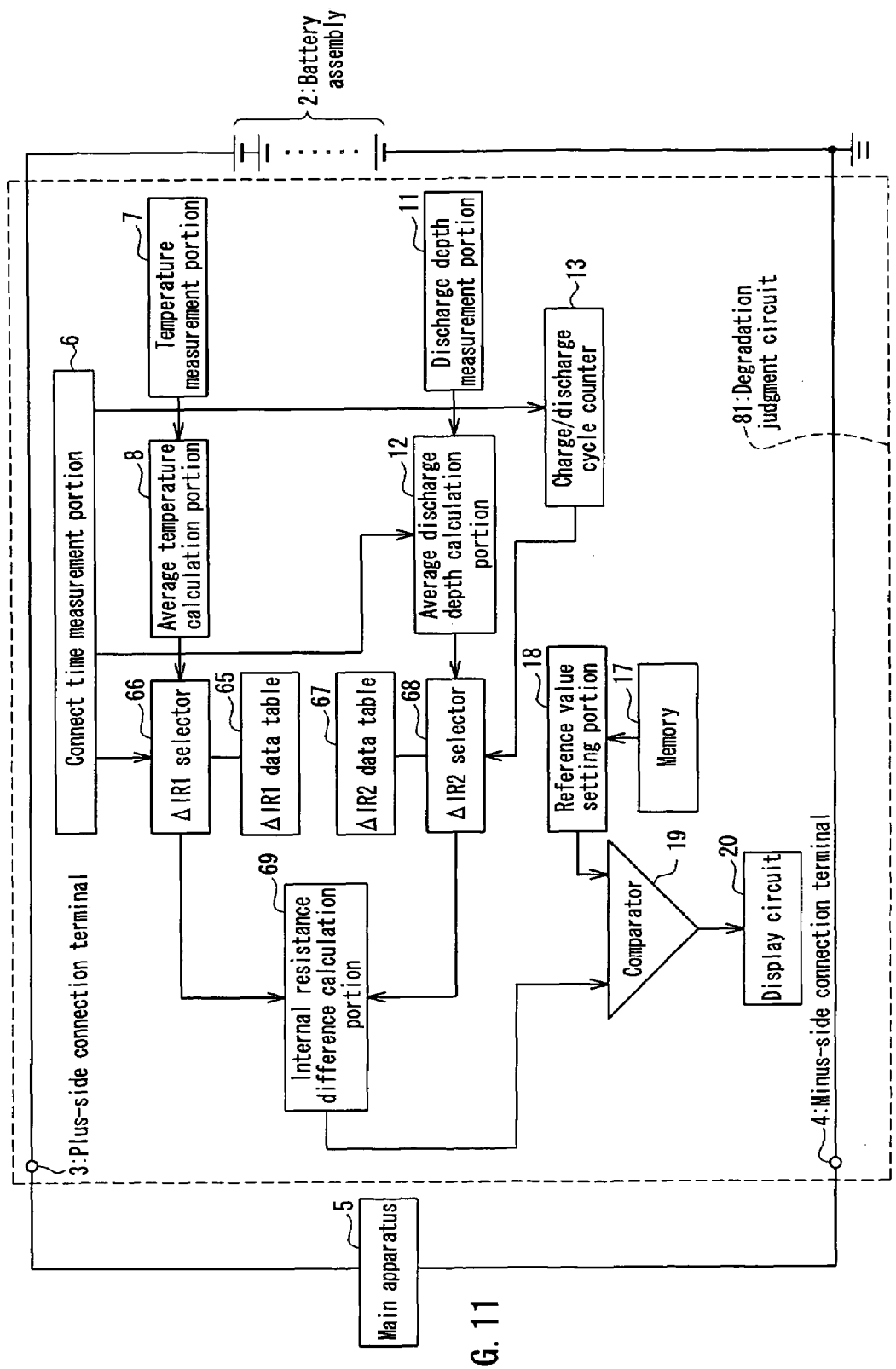
FIG. 11 is a block diagram showing the configuration of a degradation judgment circuit for a secondary battery in Embodiment 6 of the present invention.

FIG. 11 is a block diagram showing the configuration of a degradation judgment circuit for a secondary battery in Embodiment 6 of the present invention.

The following is an explanation of a degradation judgment circuit 81 in FIG. 11. The elements common to the degradation judgment circuit 1 in Embodiment 1 as shown in FIG. 1 are denoted by the same reference numerals, and the detailed description will not be repeated.

The degradation judgment circuit 81 of Embodiment 6 differs from the degradation judgment circuit 1 of Embodiment 1 in the following point. The degradation judgment circuit 1 judges degradation of the battery assembly 2 by comparing the product of CIR1 and CIR2 with the reference value, while the degradation judgment circuit 81 judges degradation of the battery assembly 2 by comparing the sum of a first internal resistance difference ($\Delta IR1$) and a second internal resistance difference ($\Delta IR2$) with the reference value. In this case, the first internal resistance difference ($\Delta IR1=IR1-IR0$) is obtained by subtracting internal resistance (IR0) of the secondary battery before being connected to the main apparatus 5 from a first internal resistance value (IR1) at the time of judging degradation, and the second internal resistance difference ($\Delta IR2=IR2-IR0$) is obtained by subtracting IR0 from a second internal resistance value (IR2) at the time of judging degradation.

Moreover, the degradation judgment circuit 81 (FIG. 11) differs from the degradation judgment circuit 1 (FIG. 1) in that it includes a $\Delta IR1$ data table 65, a $\Delta IR1$ selector 66, a $\Delta IR2$ data table 67, a $\Delta IR2$ selector 68, and an internal resistance difference calculation portion 69.

Figure 12:
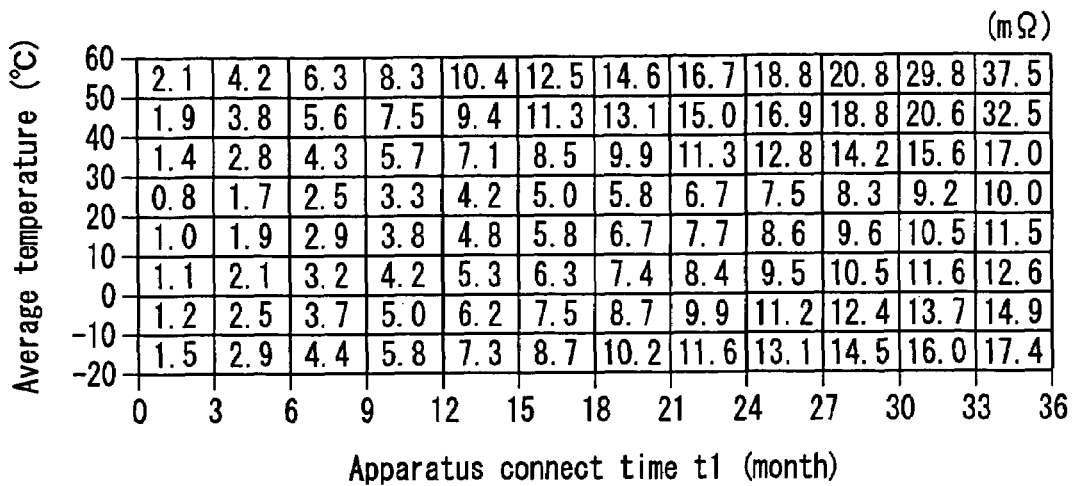
FIG. 12 shows an example of a $\Delta$IR1 data table that uses an apparatus connect time and an average temperature as parameters.

FIG. 12 shows an example of the $\Delta IR1$ data table 65 when an A-size nickel-metal hydride battery is used as the battery assembly 2. In the example of FIG. 12, the same type of battery assembly (a test battery) as the battery assembly 2 was connected to the main apparatus 5. Then, $\Delta IR1$ ($\Delta IR1=IR1-IR0$) of the test battery was measured every 3 months for 36 months from the time the test battery was connected to the main apparatus 5 at an average temperature between $-20°$ C. and $60°$ C. in increments of $10°$ C. The $\Delta IR1$ of the test battery thus measured is stored in the $\Delta IR1$ data table 65. The IR0 of the A-size nickel-metal hydride battery is about 20 m$\Omega$.

Based on the time t measured by the connect time measurement portion 6 and the average temperature calculated by the average temperature calculation portion 8, the $\Delta IR1$ selector 66 uniquely selects a $\Delta IR1$ value from the $\Delta IR1$ data table 65. For example, when t=5 (months) and the average temperature=$15°$ C., the $\Delta IR1$ value to be selected is 1.9 (m$\Omega$).

In the example of FIG. 12, the table stores data for only 36 months (3 years) of connection between the battery assembly 2 and the main apparatus 5. However, if the measured values are collected, the table can store $\Delta IR1$ that corresponds to a period of more than 36 months. When the measured values are not collected, estimated values of $\Delta IR1$ may be stored in the table.

By interpolating the elements (measured values) of the $\Delta IR1$ data table in FIG. 12, it is possible to obtain more detailed data of the connect time during which the battery assembly 2 is connected to the main apparatus 5 and the average temperature of the battery assembly 2. The $\Delta IR1$ data table 65 can be prepared beforehand in accordance with the type of the battery assembly 2.

As a specific example of this embodiment, the $\Delta IR1$ is selected from the data table that stores the measured values. However, the present invention is not limited thereto. For example, the $\Delta IR1$ may be determined by a function that includes as parameters at least an elapsed time t during which the battery assembly 2 is connected to the main apparatus 5 before judging degradation and the average temperature of the battery assembly 2 during the elapsed time t.

Like the $\Delta IR1$, the $\Delta IR2$ is a value (IR2-IR0) obtained by subtracting the internal resistance (IR0) of the secondary battery before being connected to the main apparatus 5 from the internal resistance value (IR2) at the time of judging degradation. While the $\Delta IR1$ is determined by the connect time and the average temperature during the connect time, the $\Delta IR2$ is determined by the average discharge depth and the number of charge/discharge cycles.

Figure 13:
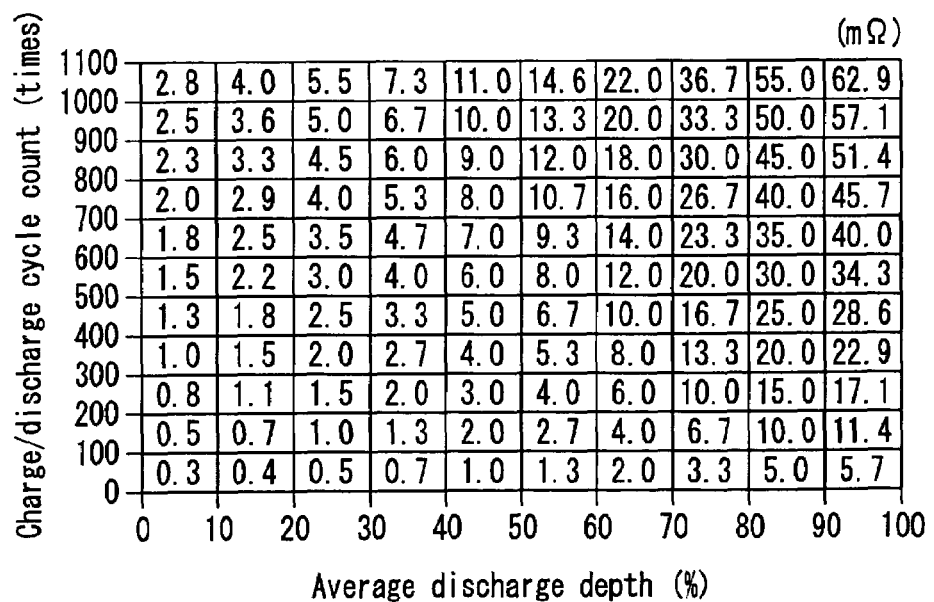
FIG. 13 shows an example of a $\Delta$IR2 data table that uses an average discharge depth and a charge/discharge cycle count as parameters.

FIG. 13 shows an example of the $\Delta IR2$ data table 67 when an A-size nickel-metal hydride battery is used as the battery assembly 2. In the example of FIG. 13, $\Delta IR2$ was measured at every 10% from 0 to 100% of the average discharge depth for a charge/discharge cycle count between 0 to 1100 times in increments of 100 times. The $\Delta IR2$ thus measured by using the same type of battery as the battery assembly 2 is stored in the $\Delta IR2$ data table 67.

Based on the average discharge depth calculated by the average discharge depth calculation portion 12 and the number of charge/discharge cycles counted by the charge/discharge cycle counter 13, the $\Delta IR2$ selector 68 uniquely selects an $\Delta IR2$ value from the $\Delta IR2$ data table 67. For example, when the average discharge depth is 15% and the number of charge/discharge cycles is 718 times, the $\Delta IR2$ value to be selected is 2.9 m$\Omega$.

The $\Delta IR2$ that corresponds to a charge/discharge cycle of more than 1100 times may be obtained by measurement or estimation and stored in the $\Delta IR2$ data table 67. By interpolating the elements (measured values) of the $\Delta IR2$ data table, it is possible to obtain more detailed data of the average discharge depth and the number of charge/discharge cycles. The $\Delta IR2$ data table 67 also can be prepared beforehand in accordance with the type of the battery assembly 2.

As a specific example of this embodiment, the $\Delta IR2$ is selected from the data table that stores the measured values. However, the present invention is not limited thereto. For example, the $\Delta IR2$ may be determined by a function that includes as parameters the average discharge depth and the number of charge/discharge cycles. In this case, the function may be obtained either theoretically or based on the measured values.

The internal resistance difference calculation portion 69 calculates an internal resistance difference based on at least the $\Delta IR1$ selected by the $\Delta IR1$ selector 66 and the $\Delta IR2$ selected by the $\Delta IR2$ selector 68. For example, the internal resistance difference can be a value ($\Delta IR1+\Delta IR2$) obtained by adding the $\Delta IR1$ and $\Delta IR2$.

The memory 17 stores a reference value beforehand. The reference value is used for judging battery degradation from the internal resistance difference. This reference value also can be determined by previous measurement using the same type of battery as the battery assembly 2. For an A-size nickel-metal hydride battery, e.g., the memory 17 preferably stores a reference value of 30 to 40 mΩ. The reference value stored in the memory 17 is set in the reference value setting portion 18. The comparator 19 compares the reference value set by the reference value setting portion 18 with the internal resistance difference (ΔIR1+ΔIR2) calculated by the internal resistance difference calculation portion 69. When the internal resistance difference is equal to or larger than the reference value, the comparator 19 judges that the battery assembly 2 is degraded. Subsequently, a message or the like that indicates the degradation of the battery assembly 2 is output to the display circuit 20.

In this embodiment, all or part of the defining terms, i.e., the out-of-temperature range defining term (k1×t1), the deep discharge defining term (k2×t2), the short-circuit defining term (k3×t3), and the full charge defining term (k4×t4) can be determined and incorporated into the degradation judgment, as described in Embodiment 3.

Embodiment 7

Figure 14:
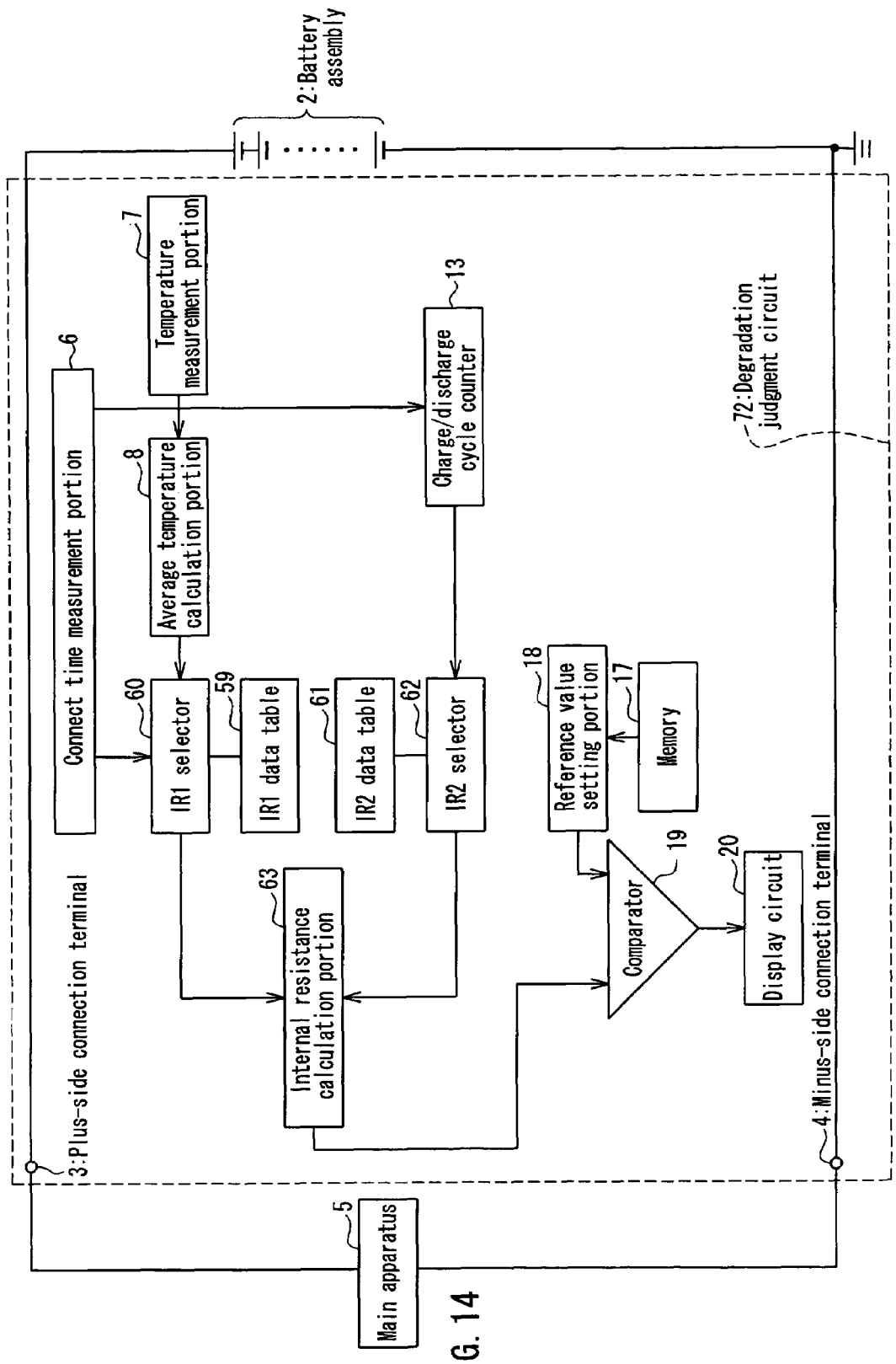
FIG. 14 is a block diagram showing the configuration of a degradation judgment circuit for a secondary battery in Embodiment 7 of the present invention.

FIG. 14 is a block diagram showing the configuration of a degradation judgment circuit 72 for a secondary battery in Embodiment 7 of the present invention. The elements common to the degradation judgment circuit 71 in Embodiment 5 are denoted by the same reference numerals, and the detailed description will not be repeated.

Embodiment 7 of the present invention is an example of the degradation judgment circuit for a secondary battery having a constant discharge depth. The secondary battery having a constant discharge depth may be used, e.g., as a backup power supply when a commercial power supply fails. When a power failure occurs during the operation of a computer, the secondary battery can serve as a backup power supply in a shutdown process for the computer. In many cases, the discharge depth of the secondary battery used in the shutdown process is constant.

In this embodiment, the battery assembly 2 has a constant discharge depth. Therefore, unlike Embodiment 5, it is necessary neither to measure a discharge depth nor to calculate an average discharge depth. Thus, the discharge depth measurement portion 11 and the average discharge depth calculation portion 12 as shown in FIG. 8 are not required.

The IR1 data table 59 may be the same as that in Embodiment 5 (see FIG. 9). The IR2 data table 61 also may be the same as that in Embodiment 5 (see FIG. 10). The IR2 selector 62 selects IR2 from the IR2 data table 61 by using the discharge depth (constant) of the battery assembly 2 and the number of charge cycles counted by the charge/discharge cycle counter 13.

Based on the IR1 and IR2 thus obtained, degradation of the battery assembly 2 is judged in the same manner as Embodiment 5, and then the result is output to the display circuit 20.

In this embodiment, all or part of the defining terms, i.e., the out-of-temperature range defining term (k1×t1), the deep discharge defining term (k2×t2), the short-circuit defining term (k3×t3), and the full charge defining term (k4×t4) can be determined and incorporated into the degradation judgment, as described in Embodiment 4.

Embodiment 8

Figure 15:
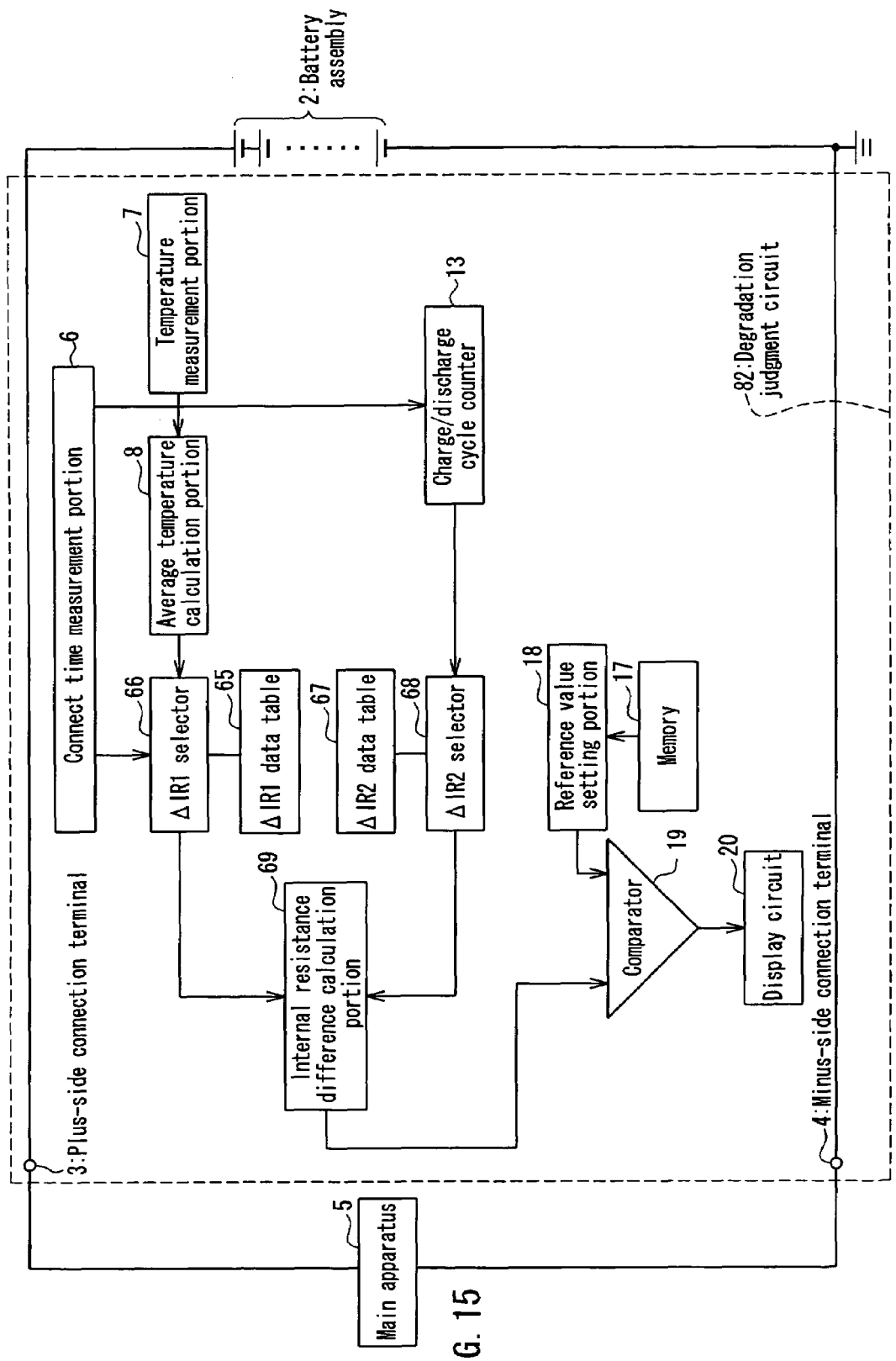
FIG. 15 is a block diagram showing the configuration of a degradation judgment circuit for a secondary battery in Embodiment 8 of the present invention.

FIG. 15 is a block diagram showing the configuration of a degradation judgment circuit 82 for a secondary battery in Embodiment 8 of the present invention. The elements common to the degradation judgment circuit 81 in Embodiment 6 are denoted by the same reference numerals, and the detailed description will not be repeated.

Embodiment 8 of the present invention is an example of the degradation judgment circuit for a secondary battery having a constant discharge depth. The secondary battery having a constant discharge depth may be used, e.g., as a backup power supply when a commercial power supply fails. When a power failure occurs during the operation of a computer, the secondary battery can serve as a backup power supply in a shutdown process for the computer. In many cases, the discharge depth of the secondary battery used in the shutdown process is constant.

In this embodiment, the battery assembly 2 has a constant discharge depth. Therefore, unlike Embodiment 6, it is necessary neither to measure a discharge depth nor to calculate an average discharge depth. Thus, the discharge depth measurement portion 11 and the average discharge depth calculation portion 12 as shown in FIG. 11 are not required.

The ΔIR1 data table 65 may be the same as that in Embodiment 6 (see FIG. 12). The ΔIR2 data table 67 also may be the same as that in Embodiment 6 (see FIG. 13). The ΔIR2 selector 68 selects ΔIR2 from the ΔIR2 data table 67 by using the discharge depth (constant) of the battery assembly 2 and the number of charge cycles counted by the charge/discharge cycle counter 13.

Based on the ΔIR1 and ΔIR2 thus obtained, degradation of the battery assembly 2 is judged in the same manner as Embodiment 6, and then the result is output to the display circuit 20.

In this embodiment, all or part of the defining terms, i.e., the out-of-temperature range defining term (k1×t1), the deep discharge defining term (k2×t2), the short-circuit defining term (k3×t3), and the full charge defining term (k4×t4) can be determined and incorporated into the degradation judgment, as described in Embodiment 4.

The specific configuration as described in each of the above embodiments is simply for the purpose of presenting an example, and the present invention is not limited thereto. In the above embodiments, a battery assembly includes a plurality of secondary batteries. However, the degradation judgment circuit of the present invention also can be used for a single secondary battery.

The present invention can be applied to a degradation judgment circuit for a secondary battery that can judge degradation quickly with a simple peripheral circuit regardless of the type of secondary battery.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A degradation judgment circuit for a secondary battery used in a main apparatus comprising:
    a time measurement portion;
    a state data acquisition portion;
    an estimation portion; and
    a judgment portion,
    wherein the time measurement portion measures a connect time during which the secondary battery is connected to the main apparatus before judging degradation of the secondary battery,
    wherein the state data acquisition portion acquires state data including data that shows an avenge temperature and a number of charge/discharge cycles of the secondary battery during a period from when the secondary battery is connected to the main apparatus to when degradation of the secondary battery is judged, the estimation portion estimates an internal resistance value or a change in internal resistance value that corresponds to a combination of the connect time measured by the time measurement portion, the average temperature, and the number of charge/discharge cycles included in the state data by using data or a function that associates a combination of various values of the connect time, the average temperature, and the number of charge/discharge cycles with the internal resistance value or the change in internal resistance value, and the judgment portion judges degradation of the secondary battery based on the result of the estimation by the estimation portion.

2. The degradation judgment circuit according to claim 1, further comprising:

wherein the state data acquisition portion comprises:

a temperature measurement portion for measuring a temperature of the secondary battery; and an average temperature calculation portion for calculating an average temperature during a period of time that the secondary battery is connected to the main apparatus before judging degradation of the secondary battery, based on the result of the measurement by the temperature measurement portion.

3. The degradation judgment circuit according to claim 1, wherein the state data acquisition portion comprises a charge/discharge cycle counter for counting the number of charge/discharge cycles until degradation of the secondary battery is judged.

4. The degradation judgment circuit according to claim 1, wherein the state data acquisition portion comprises:

a discharge depth measurement portion for measuring a discharge depth of the secondary battery; and an average discharge depth calculation portion for calculating an average discharge depth during the period from when the secondary battery is connected to the main apparatus to when degradation of the secondary battery is judged, based on. the result of the measurement by the discharge depth measurement portion; and wherein the state data includes data showing the average discharge depth.

5. The degradation judgment circuit according to claim 1, further comprising:

a data table for previously storing data that shows an internal resistance value or a change in internal resistance value of the secondary battery and is based on measurement using the same type of secondary battery as the secondary battery connected to the main apparatus, the data being stored in correspondence with the state data, wherein the estimation portion estimates (a) an internal resistance value or (b) a change in internal resistance value of the secondary battery by referring to the data table, based on the state data acquired by the state data acquisition portion.

6. The degradation judgment circuit according to claim 5, further comprising:

wherein the state data acquisition portion comprises:

a temperature measurement portion for measuring a temperature of the secondary battery; and an average temperature calculation portion for calculating an average temperature during a period of time that the secondary battery is connected to the main apparatus before judging degradation of the secondary battery, based on the result of the measurement by the temperature measurement portion, wherein the state data includes data showing the avenge temperature, wherein the data table includes a time-temperature correspondence data table for previously storing time-temperature correspondence data that shows an internal resistance value or a change in internal resistance value of the secondary battery and is based on a test using the same type of secondary battery as the secondary battery, and the time-temperature correspondence data is based on a test that examines a relationship between internal resistance of the same type of secondary battery, a time during which the same type of secondary battery is connected to the main apparatus, and a temperature of the same type of secondary battery during that time, and is stored in correspondence with both data showing the time and data showing the temperature, and wherein the estimation portion estimates (a) an internal resistance value or (b) a change in internal resistance value of the secondary battery by referring to the time-temperature correspondence data table, based on the data showing the average temperature and the data showing the connect time.

7. The degradation judgment circuit according to claim 6, wherein the state data acquisition portion comprises a charge/discharge cycle counter for counting a number of charge/discharge cycles until degradation of the secondary battery is judged, wherein the data table includes a charge cycle count correspondence data table for previously storing charge cycle count correspondence data that shows an internal resistance value or a change in internal resistance value of the secondary battery and is based on a test using the same type of secondary battery as the secondary battery connected to the main apparatus, and the charge cycle count correspondence data is based on a test that examines a relationship between internal resistance and a number of charge cycles of the same type of secondary battery, and is stored in correspondence with data showing the number of charge cycles, and wherein the estimation portion estimates (a) an internal resistance value or (b) a change in internal resistance value of the secondary battery by referring to the charge cycle count correspondence data table, based on the data showing the number of charge/discharge cycles.

8. The degradation judgment circuit according to claim 7, wherein the state data acquisition portion comprises:

a discharge depth measurement portion for measuring a discharge depth of the secondary battery; and an average discharge depth calculation portion for calculating an average discharge depth during the period from when the secondary battery is connected to the main apparatus to when degradation of the secondary battery is judged, based on the result of the measurement by the discharge depth measurement portion;

wherein the state data includes data showing the average discharge depth, wherein the charge cycle count correspondence data is based on a test that examines a relationship between internal resistance, a number of charge cycles, and a discharge depth of the same type of secondary battery, and is stored in correspondence with both data showing the number of charge cycles and data showing the discharge depth, and wherein the estimation portion estimates (a) an internal resistance value or (b) a change in internal resistance value of the secondary battery by referring to the charge cycle count correspondence data table, based on the data showing the number of charge/discharge cycles and the data showing the average discharge depth.

9. The degradation judgment circuit according to claim 8, wherein the judgment portion judges degradation of the secondary battery based on at least a value estimated by referring to the time-temperature correspondence data table and a value estimated by referring to the charge cycle count correspondence data table in the estimation portion.

10. The degradation judgment circuit according to claim 1, further comprising:
an out-of-temperature range time measurement portion for measuring a period of time that a temperature of the secondary battery is outside a predetermined temperature range defined as a temperature range in normal operation; and
an out-of-temperature range defining term calculation portion for calculating an out-of-temperature range defining term based on the period of time measured by the out-of-temperature range time measurement portion and a predetermined coefficient provided in accordance with a type of the secondary battery,
wherein the judgment portion judges degradation of the secondary battery based on the result of the estimation by the estimation portion while taking into account the out-of temperature range defining term.

11. The degradation judgment circuit according to claim 1, further comprising:
a deep discharge time measurement portion for measuring a period of time that the secondary battery is in a deep discharge state based on a voltage of the secondary battery; and
a deep discharge defining term calculation portion for calculating a deep discharge defining term based on the period of time measured by the deep discharge time measurement portion and a predetermined coefficient provided in accordance with a type of the secondary battery,
wherein the judgment portion judges degradation of the secondary battery based on the result of the estimation by the estimation portion while taking into account the deep discharge defining term.

12. The degradation judgment circuit according to claim 1, further comprising:
a short-circuit time measurement portion for measuring a period of time that the secondary battery is in a short-circuit state based on a voltage of the secondary battery; and
a short-circuit defining term calculation portion for calculating a shot-circuit defining term based on the period of time measured by the short-circuit time measurement portion and a predetermined coefficient provided in accordance with a type of the secondary battery,
wherein the judgment portion judges degradation of the secondary battery based on the result of the estimation by the estimation portion while taking into account the short-circuit defining term.

13. The degradation judgment circuit according to claim 1, further comprising:
a full charge time measurement portion for measuring a period of time that the secondary battery is in a full charge state based on a capacity of the secondary battery; and
a full charge defining term calculation portion for calculating a full charge defining term based on the period of time measured by the full charge time measurement portion and a predetermined coefficient provided in accordance with a type of the secondary battery,
wherein the judgment portion judges degradation of the secondary battery based on the result of the estimation by the estimation portion while taking into account the full charge defining term.

14. A secondary battery system comprising:
the degradation judgment circuit according to claim 1; and
a secondary battery.

15. A method for judging degradation of a secondary battery used in a main apparatus comprising the steps of:
acquiring a connect time during which the secondary battery is connected to the main apparatus before judging degradation of the secondary battery;
acquiring state data including data that shows an average temperature and a number of charge/discharge cycles of the secondary battery during a period from when the secondary battery is connected to the main apparatus to when degradation of the secondary batter is judged;
estimating an internal resistance value or a change in internal resistance value that corresponds to a combination of the connect time measured by the time measurement portion, the average temperature, and the number of charge/discharge cycles included in the state data by using data or a function that associates a combination of various values of the connect time, the average temperature, and the number of charge/discharge cycles with the internal resistance value or the change in internal resistance value; and
judging degradation of the secondary battery based on the result obtained by the estimating step.

* * * * *